United States Patent
Lin et al.

(10) Patent No.: US 10,833,806 B2
(45) Date of Patent: Nov. 10, 2020

(54) DATA RETRANSMISSION METHOD AND RELATED APPARATUS

(71) Applicant: HUAWEI TECHNOLOGIES CO., LTD., Guangdong (CN)

(72) Inventors: Tongyu Lin, Beijing (CN); Yuanyuan Li, Beijing (CN); Hao Wang, Beijing (CN); Yumei Wang, Beijing (CN); Chunchang Tian, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 46 days.

(21) Appl. No.: 16/233,882

(22) Filed: Dec. 27, 2018

(65) Prior Publication Data

US 2019/0132086 A1 May 2, 2019

Related U.S. Application Data

(63) Continuation of application No. PCT/CN2017/084297, filed on May 15, 2017.

(30) Foreign Application Priority Data

Jun. 28, 2016 (CN) .......................... 2016 1 0486859

(51) Int. Cl.
*H04L 1/08* (2006.01)
*H04L 1/00* (2006.01)
(Continued)

(52) U.S. Cl.
CPC ............ *H04L 1/08* (2013.01); *H03M 13/616* (2013.01); *H04L 1/00* (2013.01); *H04L 1/0057* (2013.01);
(Continued)

(58) Field of Classification Search
CPC ..... H04L 1/08; H04L 1/00; H04L 1/16; H04L 1/1819; H04L 1/0069; H04L 1/1845; H04L 1/0057; H03M 13/616
See application file for complete search history.

(56) References Cited

U.S. PATENT DOCUMENTS

| 6,438,723 B1 * | 8/2002 | Kalliojarvi ............ H04L 1/1816 714/751 |
| 2005/0235190 A1 * | 10/2005 | Miyazaki .............. H04L 1/1812 714/748 |

(Continued)

FOREIGN PATENT DOCUMENTS

| CN | 101286825 A | 10/2008 |
| CN | 101378304 A | 3/2009 |
| CN | 101662346 A | 3/2010 |

OTHER PUBLICATIONS

International Search Report dated Jun. 28, 2017 in corresponding International Patent Application No. PCT/CN2017/084297 (7 pages)
(Continued)

*Primary Examiner* — Thien Nguyen
(74) *Attorney, Agent, or Firm* — Kilpatrick Townsend & Stockton LLP

(57) ABSTRACT

When receiving a first data frame sent by a transmitting apparatus, a receiving apparatus may return error indication information including an identifier of at least one erroneous codeword group to the transmitting apparatus if it is found that an error occurs in an initial codeword of the first data frame. The transmitting apparatus may obtain the erroneous codeword group and encode the erroneous codeword group, and retransmit a part of a sub check codeword obtained through encoding to the receiving apparatus. The receiving apparatus may obtain a third check matrix based on a first check matrix, a second check matrix, and a location of the at least one erroneous codeword group in the initial code-
(Continued)

word, and re-decode the retransmitted partial sub check codeword and content of the first data frame together based on the third check matrix, so as to obtain a correct initial codeword.

14 Claims, 9 Drawing Sheets

(51) Int. Cl.
*H04L 1/16* (2006.01)
*H04L 1/18* (2006.01)
*H03M 13/00* (2006.01)

(52) U.S. Cl.
CPC ............. *H04L 1/0069* (2013.01); *H04L 1/16* (2013.01); *H04L 1/1819* (2013.01); *H04L 1/1845* (2013.01)

(56) References Cited

U.S. PATENT DOCUMENTS

| | | | | |
|---|---|---|---|---|
| 2006/0041816 A1* | 2/2006 | Hong | .................... | H04L 1/0637 714/749 |
| 2006/0150061 A1* | 7/2006 | Kyung | .................. | H04L 1/0057 714/758 |
| 2010/0131818 A1* | 5/2010 | Zhou | .................... | H04L 1/0057 714/751 |
| 2010/0146355 A1 | 6/2010 | Jiang et al. | | |
| 2011/0075611 A1* | 3/2011 | Choi | .................... | H04L 1/1819 370/329 |
| 2011/0078529 A1* | 3/2011 | Wu | ....................... | H04L 1/1812 714/748 |
| 2011/0199975 A1* | 8/2011 | Wu | ....................... | H04L 1/1812 370/328 |
| 2013/0019137 A1* | 1/2013 | Wu | ....................... | H04L 1/1812 714/751 |
| 2015/0333874 A1* | 11/2015 | Damola | ................ | H04L 1/0076 370/312 |
| 2018/0041974 A1* | 2/2018 | Suzuki | .................... | H04L 5/001 |
| 2019/0132086 A1* | 5/2019 | Lin | ........................... | H04L 1/00 |

OTHER PUBLICATIONS

Written Opinion of the International Searching Authority dated Jun. 28, 2017 in corresponding International Patent Application No. PCT/CN2017/084297 (4 pages).

International Search Report dated Jun. 28, 2017 in corresponding International Patent Application No. PCTCN2017/084297.

Hamid Saber et al:"A Novel Hybrid ARQ Scheme Based on LDPC Code Extension and Feedback", Vehicular Technology Conference (VTC Fall), 2012 IEEE, IEEE, Sep. 3, 2012, pp. 1-5, XP032294912.

Yazdani M et al:"Irregular rate-compatible LDPC codes for capacity-approaching hybrid-ARQ schemes", Electrical and Computer Engineering, 2004. Canadian Conference on Niagara Falls, Ont., Canada May 2-5, 2004, Piscataway, NJ, USA, IEEE, US, May 2, 2004, pp. 303-306. XP010733447.

ZTE Corp et al"Consideration on LDPC codes for NR", 3GPP Draft;R1-164278, vol. RAN WG1, No.Nanjing,China,May 23-May 27, 2016, May 14, 2015, XP051090015, 12 pages.

Intel Corporation: "LDPC code design for NR", 3GPP Draft;R1-164183, vol. RAN WG1 No.Nanjing, China;May 23-May 27, 2016, May 14, 2016, XP051090075, 4 pages.

* cited by examiner

DATA RETRANSMISSION METHOD AND RELATED APPARATUS

CROSS-REFERENCE TO RELATED APPLICATIONS

This application is a continuation of International Application No. PCT/CN2017/084297, filed on May 15, 2017, which claims priority to Chinese Patent Application No. 201610486859.7, filed on Jun. 28, 2016. The disclosures of the aforementioned applications are hereby incorporated by reference in their entireties.

TECHNICAL FIELD

The present disclosure relates to the data processing field, and in particular, to a data retransmission method and a related apparatus.

BACKGROUND

In wireless communication, data transmission is a common behavior. In a case in which a transmitting apparatus transmits a set of data to a receiving apparatus, the set of data sent by the transmitting apparatus to the receiving apparatus for the first time may be considered as an initial codeword. In a transmission process, a data error may occur in the initial codeword for some reasons, and consequently an initial codeword received by the receiving apparatus is different from the initial codeword sent by the transmitting apparatus. If the data error caused in the transmission process is not corrected, many subsequent problems are brought. Therefore, it is necessary to ensure correctness and completeness of the initial codeword in the transmission process.

In a conventional manner, a codeword is usually checked to ensure that a data error caused in a transmission process can be recognized by the receiving apparatus. Specifically, the transmitting apparatus encodes the initial codeword according to an encoding rule used for data validation (the encoding rule may be, for example, a preset check matrix), to obtain a corresponding check codeword, then forms a data frame based on the initial codeword and the check codeword, and sends the data frame to the receiving apparatus. The receiving apparatus decodes the received data frame. In the decoding process, the receiving apparatus may check the codeword to determine whether an error occurs in the initial codeword in the transmission process. The receiving apparatus returns corresponding posterior knowledge such as an acknowledgment/negative acknowledgment (ACK/NACKt) message to the transmitting apparatus based on a result of the determining, to indicate that the current initial codeword sent by the transmitting apparatus is correct or incorrect. In this way, the transmitting apparatus can determine, based on the posterior knowledge, whether the initial codeword has an error, and can retransmit the initial codeword to the receiving apparatus if the initial codeword has an error, so as to ensure correctness and completeness of the initial codeword.

In the conventional manner, if it is found that an initial codeword sent once has an error, the transmitting apparatus usually needs to again encode all content of the initial codeword sent this time, to form a data frame, and retransmit the formed data frame to the receiving apparatus. In a data transmission mechanism, a size of an initial codeword is related to a rate of transmission between the transmitting apparatus and the receiving apparatus. For example, at a high transmission rate, the size of the initial codeword can reach 4000 bits. If all the re-encoded content needs to be retransmitted once an error occurs, the retransmission of a large data amount occupies a large quantity of transmission resources, resulting in inefficient data retransmission.

SUMMARY

To resolve the foregoing technical problem, embodiments of the present invention provide a data retransmission method and a related apparatus, so as to reduce a data amount of retransmitted data and improve data retransmission efficiency on the premise of implementing correct decoding of an erroneous part.

According to a first aspect, an embodiment of the present invention provides a data retransmission method, where the method includes:

receiving, by a receiving apparatus, a first data frame sent by a transmitting apparatus, where the first data frame includes an initial codeword and a check codeword, the check codeword is obtained after the initial codeword is encoded based on a first check matrix, and the initial codeword has a plurality of codeword groups;

recognizing, by the receiving apparatus, at least one erroneous codeword group in the initial codeword;

sending, by the receiving apparatus, an error indication message to the transmitting apparatus, where the error indication message carries an identifier of the at least one erroneous codeword group;

obtaining, by the receiving apparatus, a second data frame sent by the transmitting apparatus based on the error indication message, where the second data frame includes a partial sub check codeword, the partial sub check codeword is a part of a sub check codeword, and the sub check codeword is obtained after the at least one erroneous codeword group is encoded by using a second check matrix; and decoding, by the receiving apparatus, the partial sub check codeword, the initial codeword, and the check codeword by using a third check matrix, to obtain the initial codeword, where the third check matrix is obtained based on the first check matrix, the second check matrix, and a location of the at least one erroneous codeword group in the initial codeword.

It can be learned that when receiving the first data frame sent by the transmitting apparatus, the receiving apparatus may return the error indication information including the identifier of the at least one erroneous codeword group to the transmitting apparatus if it is found that an error occurs in the initial codeword of the first data frame. When receiving the partial sub check codeword retransmitted by the transmitting apparatus, the receiving apparatus may obtain the third check matrix based on the first check matrix, the second check matrix, and the location of the at least one erroneous codeword group in the initial codeword, and re-decode the retransmitted partial sub check codeword and content of the first data frame together based on the third check matrix, so as to obtain the correct initial codeword. It can be learned that on the premise of implementing correct decoding of an erroneous part, a data amount of retransmitted data can be reduced, and data retransmission efficiency is improved.

In a possible design, the at least one erroneous codeword group includes a first codeword group, the partial sub check codeword includes a first partial sub check codeword, the sub check codeword includes a first sub check codeword, the first partial sub check codeword is a part of the first sub check codeword, and the first sub check codeword is obtained after the first codeword group is encoded by using the second check matrix.

In this way, composition of the partial sub check codeword and a manner of obtaining the partial sub check codeword when the erroneous codeword group includes the first codeword group are further clarified.

In a possible design, the at least one erroneous codeword group includes a first codeword group and a second codeword group, the partial sub check codeword includes a first partial sub check codeword and a second partial sub check codeword, the sub check codeword includes a first sub check codeword and a second sub check codeword, the first partial sub check codeword is a part of the first sub check codeword, the second partial sub check codeword is a part of the second sub check codeword, the first sub check codeword is obtained after the first codeword group is encoded by using the second check matrix, and the second sub check codeword is obtained after the second codeword group is encoded by using the second check matrix.

In this way, composition of the partial sub check codeword and a manner of obtaining the partial sub check codeword when the erroneous codeword group includes the first codeword group and the second codeword group are further clarified.

In a possible design, that the third check matrix is obtained based on the first check matrix, the second check matrix, and a location of the at least one erroneous codeword group in the initial codeword includes:

the third check matrix is obtained by tailoring the first check matrix and the second check matrix that are concatenated; in the third check matrix, a concatenation relationship between a remaining part of the second check matrix after tailoring and the first check matrix is related to the location of the at least one erroneous codeword group in the initial codeword; and a proportion of the remaining part of the second check matrix after tailoring in the second check matrix is related to a proportion of the partial sub check codeword in the sub check codeword.

In this way, a manner of obtaining the third check matrix by tailoring is further clarified.

In a possible design, the first check matrix includes a sparse matrix and a lower triangular matrix disposed on the right of the sparse matrix, the second check matrix includes a sparse matrix and a lower triangular matrix disposed on the right of the sparse matrix, the third check matrix includes a sparse matrix and a lower triangular matrix disposed on the right of the sparse matrix, the at least one erroneous codeword group includes the first codeword group, and that the third check matrix is obtained by tailoring the first check matrix and the second check matrix that are concatenated includes:

in the first check matrix and the second check matrix that are concatenated, a row number of a first row of the lower triangular matrix of the second check matrix is a row number of a last row of the first check matrix plus 1, and a column number of a first column of the lower triangular matrix of the second check matrix is a column number of a last column of the first check matrix plus 1; a quantity of rows and a quantity of columns by which the first check matrix and the second check matrix that are concatenated are tailored are determined based on a proportion of the first partial sub check codeword in the first sub check codeword; the sparse matrix of the third check matrix includes the sparse matrix of the first check matrix and a part of the sparse matrix of the second check matrix, and the lower triangular matrix of the third check matrix includes the lower triangular matrix of the first check matrix and a part of the lower triangular matrix of the second check matrix;

that a concatenation relationship between a remaining part of the second check matrix after tailoring and the first check matrix is related to the location of the at least one erroneous codeword group in the initial codeword includes:

the sparse matrix of the second check matrix is concatenated at the bottom of the sparse matrix of the first check matrix, and a concatenation location is consistent with a location of the first codeword group in the initial codeword; and that a proportion of the remaining part of the second check matrix after tailoring in the second check matrix is related to a proportion of the partial sub check codeword in the sub check codeword includes:

a proportion of a remaining part of the lower triangular matrix of the second check matrix after tailoring in the lower triangular matrix of the second check matrix is equal to a square of the proportion of the first partial sub check codeword in the first sub check codeword.

In a possible design, the first check matrix includes a sparse matrix and a lower triangular matrix disposed on the right of the sparse matrix, the second check matrix includes sparse matrices and a lower triangular matrix disposed on the right of the sparse matrices, the third check matrix includes a sparse matrix and a lower triangular matrix disposed on the right of the sparse matrix, the at least one erroneous codeword group includes the first codeword group and the second codeword group, and that the third check matrix is obtained by tailoring the first check matrix and the second check matrix that are concatenated includes:

in the first check matrix and the second check matrix that are concatenated, a row number of a first row of the lower triangular matrix of the second check matrix is a row number of a last row of the first check matrix plus 1, and a column number of a first column of the lower triangular matrix of the second check matrix is a column number of a last column of the first check matrix plus 1; a quantity of rows and a quantity of columns by which the first check matrix and the second check matrix that are concatenated are tailored are determined based on a proportion of the first partial sub check codeword in the first sub check codeword and a proportion of the second partial sub check codeword in the second sub check codeword; the sparse matrix of the third check matrix includes the sparse matrix of the first check matrix and two parts of the sparse matrices of the second check matrix, and the lower triangular matrix of the third check matrix includes the lower triangular matrix of the first check matrix and a part of the lower triangular matrix of the second check matrix;

that a concatenation relationship between a remaining part of the second check matrix after tailoring and the first check matrix is related to the location of the at least one erroneous codeword group in the initial codeword includes:

the sparse matrices of the second check matrix are respectively concatenated at two locations below the sparse matrix of the first check matrix, a first concatenation location is consistent with a location of the first codeword group in the initial codeword, and a second concatenation location is consistent with a location of the second codeword group in the initial codeword; and that a proportion of the remaining part of the second check matrix after tailoring in the second check matrix is related to a proportion of the partial sub check codeword in the sub check codeword includes:

a proportion of a remaining part of the lower triangular matrix of the second check matrix after tailoring in the lower triangular matrix of the second check matrix is equal to a square of a sum of the proportion of the first partial sub check codeword in the first sub check codeword and the proportion of the second partial sub check codeword in the second sub check codeword.

In a possible design, the first check matrix includes a sparse matrix and a lower triangular matrix disposed on the right of the sparse matrix, the second check matrix includes a sparse matrix and a lower triangular matrix disposed on the right of the sparse matrix, the third check matrix includes a sparse matrix and a lower triangular matrix disposed on the right of the sparse matrix, the at least one erroneous codeword group includes the first codeword group and the second codeword group, and that the third check matrix is obtained by tailoring the first check matrix and the second check matrix that are concatenated includes:

the third check matrix is obtained based on an intermediate matrix, the second check matrix, and a location of the second codeword group in the initial codeword, where in the intermediate matrix and the second check matrix that are concatenated, a row number of a first row of the lower triangular matrix of the second check matrix is a row number of a last row of the intermediate matrix plus 1, and a column number of a first column of the lower triangular matrix of the second check matrix is a column number of a last column of the intermediate matrix plus 1; a quantity of rows and a quantity of columns by which the intermediate matrix and the second check matrix that are concatenated are tailored are determined based on a proportion of the first partial sub check codeword in the first sub check codeword and a proportion of the second partial sub check codeword in the second sub check codeword; the sparse matrix of the third check matrix includes a sparse matrix of the intermediate matrix and a part of the sparse matrix of the second check matrix, and the lower triangular matrix of the third check matrix includes a lower triangular matrix of the intermediate matrix and a part of the lower triangular matrix of the second check matrix;

that a concatenation relationship between a remaining part of the second check matrix after tailoring and the first check matrix is related to the location of the at least one erroneous codeword group in the initial codeword includes:

the sparse matrix of the second check matrix after tailoring is concatenated at the bottom of the sparse matrix of the intermediate matrix, and a concatenation location is consistent with the location of the second codeword group in the initial codeword;

that a proportion of the remaining part of the second check matrix after tailoring in the second check matrix is related to a proportion of the partial sub check codeword in the sub check codeword includes:

a proportion of a remaining part of the lower triangular matrix of the second check matrix after tailoring in the lower triangular matrix of the second check matrix is equal to a square of the proportion of the second partial sub check codeword in the second sub check codeword;

the intermediate matrix is obtained by tailoring the first check matrix and the second check matrix that are concatenated; in the first check matrix and the second check matrix that are concatenated, a row number of a first row of a lower triangular matrix of the second check matrix is a row number of a last row of the first check matrix plus 1, and a column number of a first column of the lower triangular matrix of the second check matrix is a column number of a last column of the first check matrix plus 1; a quantity of rows and a quantity of columns by which the first check matrix and the second check matrix that are concatenated are tailored are determined based on the proportion of the first partial sub check codeword in the first sub check codeword; the sparse matrix of the intermediate matrix includes the sparse matrix of the first check matrix and a part of a sparse matrix of the second check matrix, and the lower triangular matrix of the intermediate matrix includes the lower triangular matrix of the first check matrix and a part of the lower triangular matrix of the second check matrix; and in the intermediate matrix, the sparse matrix of the second check matrix is concatenated at the bottom of the sparse matrix of the first check matrix, and a concatenation location is consistent with a location of the first codeword group in the initial codeword; and a proportion of a remaining part of the lower triangular matrix of the second check matrix after tailoring in the lower triangular matrix of the second check matrix is equal to a square of the proportion of the first partial sub check codeword in the first sub check codeword.

According to a second aspect, an embodiment of the present invention provides a receiving apparatus, where the apparatus includes a receiving unit, a sending unit, and a processing unit, where the receiving unit is configured to receive a first data frame sent by a transmitting apparatus, where the first data frame includes an initial codeword and a check codeword, the check codeword is obtained after the initial codeword is encoded based on a first check matrix, and the initial codeword has a plurality of codeword groups;

the processing unit is configured to recognize at least one erroneous codeword group in the initial codeword;

the sending unit is configured to send an error indication message to the transmitting apparatus, where the error indication message carries an identifier of the at least one erroneous codeword group;

the receiving unit is further configured to obtain a second data frame sent by the transmitting apparatus based on the error indication message, where the second data frame includes a partial sub check codeword, the partial sub check codeword is a part of a sub check codeword, and the sub check codeword is obtained after the at least one erroneous codeword group is encoded by using a second check matrix; and the processing unit is further configured to decode the partial sub check codeword, the initial codeword, and the check codeword by using a third check matrix, to obtain the initial codeword, where the third check matrix is obtained based on the first check matrix, the second check matrix, and a location of the at least one erroneous codeword group in the initial codeword.

It can be learned that when receiving the first data frame sent by the transmitting apparatus, the receiving apparatus may return the error indication information including the identifier of the at least one erroneous codeword group to the transmitting apparatus if it is found that an error occurs in the initial codeword of the first data frame. When receiving the partial sub check codeword retransmitted by the transmitting apparatus, the receiving apparatus may obtain the third check matrix based on the first check matrix, the second check matrix, and the location of the at least one erroneous codeword group in the initial codeword, and re-decode the retransmitted partial sub check codeword and content of the first data frame together based on the third check matrix, so as to obtain the correct initial codeword. It can be learned that on the premise of implementing correct decoding of an erroneous part, a data amount of retransmitted data can be reduced, and data retransmission efficiency is improved.

In a possible design, the at least one erroneous codeword group includes a first codeword group, the partial sub check codeword includes a first partial sub check codeword, the sub check codeword includes a first sub check codeword, the first partial sub check codeword is a part of the first sub check codeword, and the first sub check codeword is obtained after the first codeword group is encoded by using the second check matrix.

In this way, composition and a manner of obtaining the partial sub check codeword when the erroneous codeword group includes the first codeword group are further clarified.

In a possible design, the at least one erroneous codeword group includes a first codeword group and a second codeword group, the partial sub check codeword includes a first partial sub check codeword and a second partial sub check codeword, the sub check codeword includes a first sub check codeword and a second sub check codeword, the first partial sub check codeword is a part of the first sub check codeword, the second partial sub check codeword is a part of the second sub check codeword, the first sub check codeword is obtained after the first codeword group is encoded by using the second check matrix, and the second sub check codeword is obtained after the second codeword group is encoded by using the second check matrix.

In this way, composition of the partial sub check codeword and a manner of obtaining the partial sub check codeword when the erroneous codeword group includes the first codeword group and the second codeword group are further clarified.

In a possible design, that the third check matrix is obtained based on the first check matrix, the second check matrix, and a location of the at least one erroneous codeword group in the initial codeword includes:

the third check matrix is obtained by tailoring the first check matrix and the second check matrix that are concatenated; in the third check matrix, a concatenation relationship between a remaining part of the second check matrix after tailoring and the first check matrix is related to the location of the at least one erroneous codeword group in the initial codeword; and a proportion of the remaining part of the second check matrix after tailoring in the second check matrix is related to a proportion of the partial sub check codeword in the sub check codeword.

In this way, a manner of obtaining the third check matrix by tailoring is further clarified.

In a possible design, the first check matrix includes a sparse matrix and a lower triangular matrix disposed on the right of the sparse matrix, the second check matrix includes a sparse matrix and a lower triangular matrix disposed on the right of the sparse matrix, the third check matrix includes a sparse matrix and a lower triangular matrix disposed on the right of the sparse matrix, the at least one erroneous codeword group includes the first codeword group, and that the third check matrix is obtained by tailoring the first check matrix and the second check matrix that are concatenated includes:

in the first check matrix and the second check matrix that are concatenated, a row number of a first row of the lower triangular matrix of the second check matrix is a row number of a last row of the first check matrix plus 1, and a column number of a first column of the lower triangular matrix of the second check matrix is a column number of a last column of the first check matrix plus 1; a quantity of rows and a quantity of columns by which the first check matrix and the second check matrix that are concatenated are tailored are determined based on a proportion of the first partial sub check codeword in the first sub check codeword; the sparse matrix of the third check matrix includes the sparse matrix of the first check matrix and a part of the sparse matrix of the second check matrix, and the lower triangular matrix of the third check matrix includes the lower triangular matrix of the first check matrix and a part of the lower triangular matrix of the second check matrix;

that a concatenation relationship between a remaining part of the second check matrix after tailoring and the first check matrix is related to the location of the at least one erroneous codeword group in the initial codeword includes:

the sparse matrix of the second check matrix is concatenated at the bottom of the sparse matrix of the first check matrix, and a concatenation location is consistent with a location of the first codeword group in the initial codeword; and that a proportion of the remaining part of the second check matrix after tailoring in the second check matrix is related to a proportion of the partial sub check codeword in the sub check codeword includes:

a proportion of a remaining part of the lower triangular matrix of the second check matrix after tailoring in the lower triangular matrix of the second check matrix is equal to a square of the proportion of the first partial sub check codeword in the first sub check codeword.

In a possible design, the first check matrix includes a sparse matrix and a lower triangular matrix disposed on the right of the sparse matrix, the second check matrix includes sparse matrices and a lower triangular matrix disposed on the right of the sparse matrices, the third check matrix includes a sparse matrix and a lower triangular matrix disposed on the right of the sparse matrix, the at least one erroneous codeword group includes the first codeword group and the second codeword group, and that the third check matrix is obtained by tailoring the first check matrix and the second check matrix that are concatenated includes:

in the first check matrix and the second check matrix that are concatenated, a row number of a first row of the lower triangular matrix of the second check matrix is a row number of a last row of the first check matrix plus 1, and a column number of a first column of the lower triangular matrix of the second check matrix is a column number of a last column of the first check matrix plus 1; a quantity of rows and a quantity of columns by which the first check matrix and the second check matrix that are concatenated are tailored are determined based on a proportion of the first partial sub check codeword in the first sub check codeword and a proportion of the second partial sub check codeword in the second sub check codeword; the sparse matrix of the third check matrix includes the sparse matrix of the first check matrix and two parts of the sparse matrices of the second check matrix, and the lower triangular matrix of the third check matrix includes the lower triangular matrix of the first check matrix and a part of the lower triangular matrix of the second check matrix;

that a concatenation relationship between a remaining part of the second check matrix after tailoring and the first check matrix is related to the location of the at least one erroneous codeword group in the initial codeword includes:

the sparse matrices of the second check matrix are respectively concatenated at two locations below the sparse matrix of the first check matrix, a first concatenation location is consistent with a location of the first codeword group in the initial codeword, and a second concatenation location is consistent with a location of the second codeword group in the initial codeword; and that a proportion of the remaining part of the second check matrix after tailoring in the second check matrix is related to a proportion of the partial sub check codeword in the sub check codeword includes:

a proportion of a remaining part of the lower triangular matrix of the second check matrix after tailoring in the lower triangular matrix of the second check matrix is equal to a square of a sum of the proportion of the first partial sub check codeword in the first sub check codeword and the proportion of the second partial sub check codeword in the second sub check codeword.

In a possible design, the first check matrix includes a sparse matrix and a lower triangular matrix disposed on the right of the sparse matrix, the second check matrix includes a sparse matrix and a lower triangular matrix disposed on the right of the sparse matrix, the third check matrix includes a sparse matrix and a lower triangular matrix disposed on the right of the sparse matrix, the at least one erroneous codeword group includes the first codeword group and the second codeword group, and that the third check matrix is obtained by tailoring the first check matrix and the second check matrix that are concatenated includes:

the third check matrix is obtained based on an intermediate matrix, the second check matrix, and a location of the second codeword group in the initial codeword, where in the intermediate matrix and the second check matrix that are concatenated, a row number of a first row of the lower triangular matrix of the second check matrix is a row number of a last row of the intermediate matrix plus 1, and a column number of a first column of the lower triangular matrix of the second check matrix is a column number of a last column of the intermediate matrix plus 1; a quantity of rows and a quantity of columns by which the intermediate matrix and the second check matrix that are concatenated are tailored are determined based on a proportion of the first partial sub check codeword in the first sub check codeword and a proportion of the second partial sub check codeword in the second sub check codeword; the sparse matrix of the third check matrix includes a sparse matrix of the intermediate matrix and a part of the sparse matrix of the second check matrix, and the lower triangular matrix of the third check matrix includes a lower triangular matrix of the intermediate matrix and a part of the lower triangular matrix of the second check matrix;

that a concatenation relationship between a remaining part of the second check matrix after tailoring and the first check matrix is related to the location of the at least one erroneous codeword group in the initial codeword includes:

the sparse matrix of the second check matrix after tailoring is concatenated at the bottom of the sparse matrix of the intermediate matrix, and a concatenation location is consistent with the location of the second codeword group in the initial codeword;

that a proportion of the remaining part of the second check matrix after tailoring in the second check matrix is related to a proportion of the partial sub check codeword in the sub check codeword includes:

a proportion of a remaining part of the lower triangular matrix of the second check matrix after tailoring in the lower triangular matrix of the second check matrix is equal to a square of the proportion of the second partial sub check codeword in the second sub check codeword;

the intermediate matrix is obtained by tailoring the first check matrix and the second check matrix that are concatenated; in the first check matrix and the second check matrix that are concatenated, a row number of a first row of a lower triangular matrix of the second check matrix is a row number of a last row of the first check matrix plus 1, and a column number of a first column of the lower triangular matrix of the second check matrix is a column number of a last column of the first check matrix plus 1; a quantity of rows and a quantity of columns by which the first check matrix and the second check matrix that are concatenated are tailored are determined based on the proportion of the first partial sub check codeword in the first sub check codeword; the sparse matrix of the intermediate matrix includes the sparse matrix of the first check matrix and a part of a sparse matrix of the second check matrix, and the lower triangular matrix of the intermediate matrix includes the lower triangular matrix of the first check matrix and a part of the lower triangular matrix of the second check matrix; and in the intermediate matrix, the sparse matrix of the second check matrix is concatenated at the bottom of the sparse matrix of the first check matrix, and a concatenation location is consistent with a location of the first codeword group in the initial codeword; and a proportion of a remaining part of the lower triangular matrix of the second check matrix after tailoring in the lower triangular matrix of the second check matrix is equal to a square of the proportion of the first partial sub check codeword in the first sub check codeword.

According to a third aspect, an embodiment of the present invention provides a data retransmission method, where the method includes:

encoding, by a transmitting apparatus, an initial codeword based on a first check matrix to obtain a check codeword, where the initial codeword has a plurality of codeword groups;

sending, by the transmitting apparatus, a first data frame to a receiving apparatus, where the first data frame includes the initial codeword and the check codeword;

obtaining, by the transmitting apparatus, error indication information returned by the receiving apparatus, where the error indication information carries an identifier of at least one erroneous codeword group;

obtaining, by the transmitting apparatus, the at least one erroneous codeword group based on the identifier of the at least one erroneous codeword group;

encoding, by the transmitting apparatus, the at least one erroneous codeword group based on a second check matrix to obtain a sub check codeword; and sending, by the transmitting apparatus, a second data frame including a partial sub check codeword to the receiving apparatus, where the partial sub check codeword is a part of the sub check codeword.

It can be learned that if the receiving apparatus finds that an error occurs in the initial codeword of the first data frame, the transmitting apparatus can receive the error indication information that includes the identifier of the at least one erroneous codeword group and that is returned by the receiving apparatus. The transmitting apparatus can obtain the corresponding at least one erroneous codeword group based on the error indication information, and perform encoding by using the second check matrix, to obtain the sub check codeword. The transmitting apparatus can send a part of the sub check codeword, namely the partial sub check codeword to the receiving apparatus by using the second data frame, so that a data amount of retransmitted data is reduced, and data retransmission efficiency is improved.

In a possible design, the at least one erroneous codeword group includes a first codeword group, the partial sub check codeword includes a first partial sub check codeword, the sub check codeword includes a first sub check codeword, the first partial sub check codeword is a part of the first sub check codeword, and the first sub check codeword is obtained after the first codeword group is encoded by using the second check matrix.

In this way, composition and a manner of obtaining the partial sub check codeword when the erroneous codeword group includes the first codeword group are further clarified.

In a possible design, the at least one erroneous codeword group includes a first codeword group and a second codeword group, the partial sub check codeword includes a first partial sub check codeword and a second partial sub check codeword, the sub check codeword includes a first sub check codeword and a second sub check codeword, the first partial sub check codeword is a part of the first sub check codeword, the second partial sub check codeword is a part of the second sub check codeword, the first sub check codeword is obtained after the first codeword group is encoded by using the second check matrix, and the second sub check codeword is obtained after the second codeword group is encoded by using the second check matrix.

In this way, composition of the partial sub check codeword and a manner of obtaining the partial sub check codeword when the erroneous codeword group includes the first codeword group and the second codeword group are further clarified.

According to a fourth aspect, an embodiment of the present invention provides a transmitting apparatus, where the apparatus includes a receiving unit, a sending unit, and a processing unit, where the processing unit is configured to encode an initial codeword based on a first check matrix to obtain a check codeword, where the initial codeword has a plurality of codeword groups;

the sending unit is configured to send a first data frame to a receiving apparatus, where the first data frame includes the initial codeword and the check codeword;

the receiving unit is configured to obtain error indication information returned by the receiving apparatus, where the error indication information carries an identifier of at least one erroneous codeword group;

the processing unit is further configured to obtain the at least one erroneous codeword group based on the identifier of the at least one erroneous codeword group;

the processing unit is further configured to encode the at least one erroneous codeword group based on a second check matrix to obtain a sub check codeword; and the sending unit is further configured to send a second data frame including a partial sub check codeword to the receiving apparatus, where the partial sub check codeword is a part of the sub check codeword.

It can be learned that if the receiving apparatus finds that an error occurs in the initial codeword of the first data frame, the transmitting apparatus can receive the error indication information that includes the identifier of the at least one erroneous codeword group and that is returned by the receiving apparatus. The transmitting apparatus can obtain the corresponding at least one erroneous codeword group based on the error indication information, and perform encoding by using the second check matrix, to obtain the sub check codeword. The transmitting apparatus can send a part of the sub check codeword, namely the partial sub check codeword to the receiving apparatus by using the second data frame, so that a data amount of retransmitted data is reduced, and data retransmission efficiency is improved.

In a possible design, the at least one erroneous codeword group includes a first codeword group, the partial sub check codeword includes a first partial sub check codeword, the sub check codeword includes a first sub check codeword, the first partial sub check codeword is a part of the first sub check codeword, and the first sub check codeword is obtained after the first codeword group is encoded by using the second check matrix.

In this way, composition and a manner of obtaining the partial sub check codeword when the erroneous codeword group includes the first codeword group are further clarified.

In a possible design, the at least one erroneous codeword group includes a first codeword group and a second codeword group, the partial sub check codeword includes a first partial sub check codeword and a second partial sub check codeword, the sub check codeword includes a first sub check codeword and a second sub check codeword, the first partial sub check codeword is a part of the first sub check codeword, the second partial sub check codeword is a part of the second sub check codeword, the first sub check codeword is obtained after the first codeword group is encoded by using the second check matrix, and the second sub check codeword is obtained after the second codeword group is encoded by using the second check matrix.

In this way, composition of the partial sub check codeword and a manner of obtaining the partial sub check codeword when the erroneous codeword group includes the first codeword group and the second codeword group are further clarified.

BRIEF DESCRIPTION OF DRAWINGS

To describe the technical solutions in the embodiments of the present invention more clearly, the following briefly describes the accompanying drawings required for describing the embodiments. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

Figure 1:
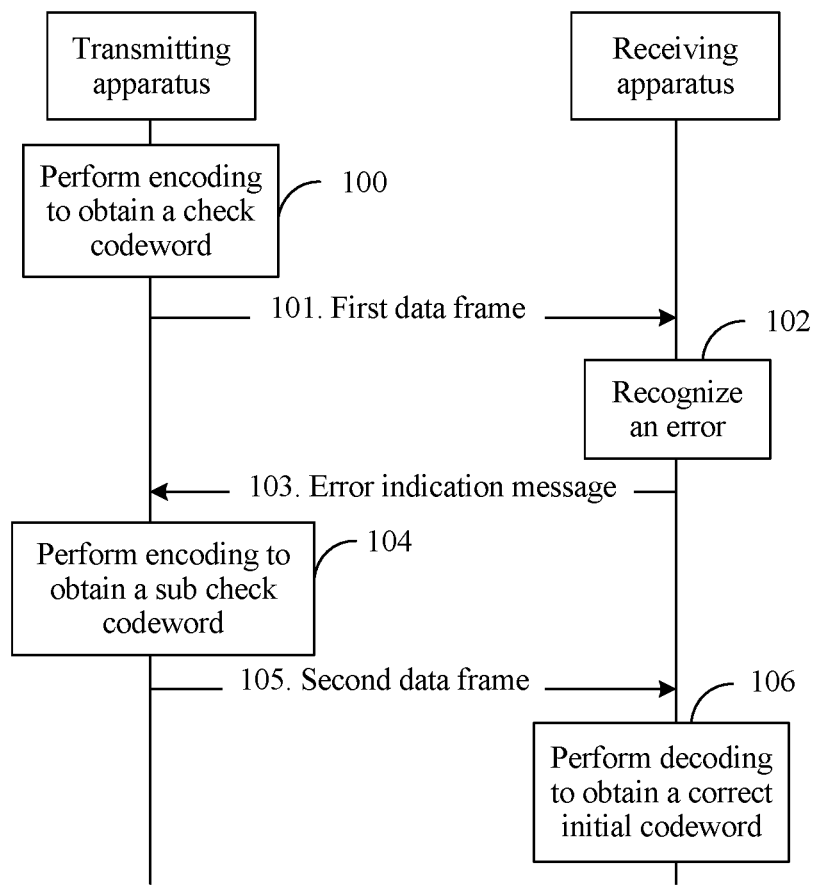
FIG. 1 is a schematic signaling flowchart of a data retransmission method according to an embodiment of the present invention.

The following clearly describes the technical solutions in the embodiments of the present invention with reference to the accompanying drawings in the embodiments of the present invention. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

In wireless communication, it is necessary to ensure data transmission accuracy. If an error occurs in data in a transmission process, data retransmission can be performed in a targeted manner. For example, in a case in which a transmitting apparatus transmits a set of data to a receiving apparatus, data sent by the transmitting apparatus to the receiving apparatus for the first time may be considered as an initial codeword, and if it is found that an initial codeword sent once has an error, the transmitting apparatus usually needs to re-encode all content of the initial codeword transmitted this time, and retransmit a formed data frame to the receiving apparatus. The retransmission of a large data amount occupies a large quantity of transmission resources, resulting in inefficient data retransmission.

If a specific location of the erroneous data in the initial codeword can be accurately located, in the data retransmission phase, there is a possibility of retransmitting only a part corresponding to the erroneous data in the initial codeword, thereby reducing an amount of data transmitted in the data retransmission phase. However, if only the part corresponding to the erroneous data in the initial codeword is retransmitted, the receiving apparatus cannot correctly decode the received part of data in a conventional manner. In other words, if the retransmitted data cannot be correctly decoded by the receiving apparatus, the data retransmission of a small amount of data does not have any practical significance.

The embodiments of the present invention are mainly applied in a scenario of a wireless communication data transmission process, and the data transmission process involves a transmitting apparatus and a receiving apparatus. The transmitting apparatus and the receiving apparatus may be various devices, such as a base station, a mobile terminal, and a router, that have data transmission and receiving functions in wireless communication. A data transmission process can be understood as sending data from a base station to a mobile terminal, or sending data from a mobile terminal to a base station, or sending data from a base station to another base station.

In a data transmission process, a first check matrix used by the transmitting apparatus for encoding and used by the receiving apparatus for decoding may be negotiated and agreed on in advance by the transmitting apparatus and the receiving apparatus. An initial codeword that the transmitting apparatus needs to send to the receiving apparatus has a plurality of codeword groups. Grouping of the initial codeword may be performed in advance, or may be performed when the transmitting apparatus encodes the initial codeword. The codeword groups of the initial codeword may have the same size. The transmitting apparatus may encode any one of the plurality of codeword groups by using a second check matrix, and correspondingly the receiving apparatus may perform decoding by using the second check matrix. The second check matrix may also be negotiated and agreed on in advance by the transmitting apparatus and the receiving apparatus. In the embodiments of the present invention, the encoding and decoding processes may be performed based on a low-density parity-check (LDPC) technology.

In view of this, the embodiments of the present invention provide a data retransmission method and a related apparatus. When receiving a first data frame sent by a transmitting apparatus, a receiving apparatus may return error indication information including an identifier of at least one erroneous codeword group to the transmitting apparatus if it is found that an error occurs in an initial codeword of the first data frame. When receiving a partial sub check codeword retransmitted by the transmitting apparatus, the receiving apparatus may obtain a third check matrix based on the first check matrix, a second check matrix, and a location of the at least one erroneous codeword group in the initial codeword, and re-decode the retransmitted partial sub check codeword and content of the first data frame together based on the third check matrix, so as to obtain a correct initial codeword. It can be learned that on the premise of implementing correct decoding of an erroneous part, a data amount of retransmitted data can be reduced, and data retransmission efficiency is improved.

The following describes the data retransmission method provided in the embodiments of the present invention with reference to the accompanying drawings. FIG. 1 is a schematic signaling flowchart of a data retransmission method according to an embodiment of the present invention. An application scenario may include an initial codeword transmission process in a data transmission process of the transmitting apparatus and the receiving apparatus, and a targeted retransmission process when a transmission error occurs in the transmission. The method includes the following steps.

100. The transmitting apparatus encodes an initial codeword based on a first check matrix to obtain a check codeword, where the initial codeword has a plurality of codeword groups.

Figure 2:
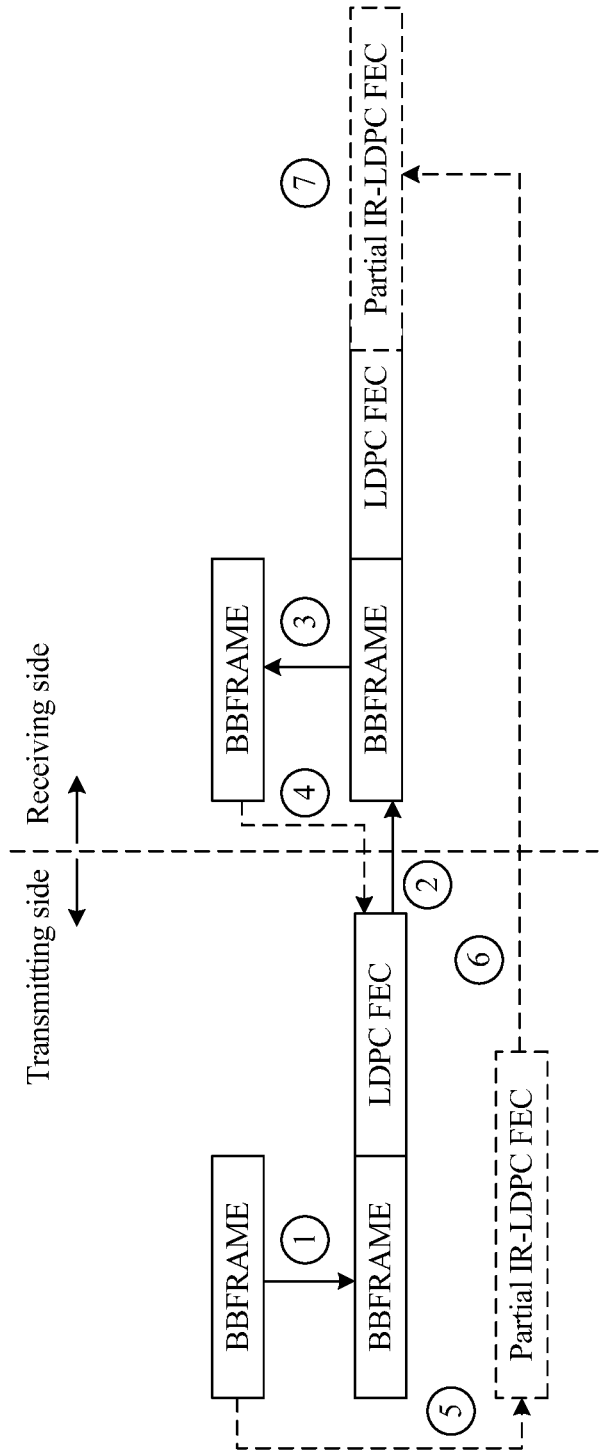
FIG. 2 is a diagram of a transmission structure of a data retransmission method according to an embodiment of the present invention.

This step may be understood as a process in which the transmitting apparatus encodes the initial codeword before the transmitting apparatus sends the initial codeword. For example, the transmitting apparatus may encode the initial codeword based on the first check matrix in an LDPC encoding manner, to obtain the check codeword. Refer to FIG. 2. FIG. 2 shows a transmission structure of the data retransmission method provided in the embodiment of the present invention in a codeword form. As indicated by the arrows on the transmitting side and the receiving side in FIG. 2, the left half of FIG. 2 shows actions performed by the transmitting apparatus and objects for the actions, and the right half of FIG. 2 shows actions performed by the receiving apparatus and objects for the actions. In FIG. 2, BBFRAME is the initial codeword. Through LDPC encoding in step ①, the transmitting apparatus encodes BBFRAME to obtain a low-density parity-check forward error correction (LDPC FEC) codeword, namely the check codeword.

The codeword groups of the initial codeword are as described above, and details are not described herein again.

101. The transmitting apparatus sends a first data frame to the receiving apparatus, where the first data frame includes the initial codeword and the check codeword.

For example, the transmitting apparatus may concatenate the check codeword to an end of the initial codeword to form the first data frame having a long codeword data structure. The first data frame may be a data structure including "BBFRAME" and "LDPC FEC" shown in FIG. 2, and is transmitted to the receiving apparatus through step ②.

102. The receiving apparatus recognizes at least one erroneous codeword group in the initial codeword after receiving the first data frame.

For example, in this embodiment of the present invention, attention is mainly paid on how to deal with a case in which a transmission error occurs in the initial codeword, and a manner in which the receiving apparatus determines whether an error occurs in the initial codeword is not limited in the present invention. It should be noted that a term definition of the error codeword group appearing in this step may be understood as a codeword group that is in the initial codeword and in which an error occurs.

After receiving the first data frame sent by the transmitting apparatus, the receiving apparatus may directly invoke the first check matrix that is agreed on, to decode the first data frame and determine whether an error occurs in the initial codeword. In addition, according to an error estimating-low density parity check (EE-LDPC) solution, the receiving apparatus can not only determine whether an error occurs in the initial codeword, but also recognize one or more codeword groups in which errors specifically occur because the initial codeword has a data structure of the plurality of code groups. For example, referring to step ③ shown in FIG. 2, the receiving apparatus may decode the first data frame by using the first check matrix to obtain BBFRAME, and may determine that an error occurs in BBFRAME based on a result of the decoding. In addition, if BBFRAME has ten codeword groups, the receiving apparatus may further determine that errors occur in, for example, a first codeword group and a fourth codeword group.

103. The receiving apparatus sends an error indication message to the transmitting apparatus, where the error indication message carries an identifier of the at least one erroneous codeword group.

For example, the receiving apparatus may send the error indication message to the transmitting apparatus in different manners. For example, a new message is generated to carry the identifier of the at least one erroneous codeword group, and the new message is used as the error indication message and is sent to the transmitting apparatus. Alternatively, an existing message is used as the error indication message. For example, the identifier of the at least one erroneous codeword group is carried in conventional posterior information, and the posterior information specific to the first data frame is used as the error indication message.

The error indication message carries the identifier of the erroneous codeword group and is used to indicate, to the transmitting apparatus, one or more codeword groups in which errors specifically occur. An identification manner may be that one erroneous codeword group corresponds to one identifier.

For an implementation of step 103, refer to step ④ in FIG. 2: The receiving apparatus feeds back a location of the error to the transmitting apparatus.

104. The transmitting apparatus obtains the at least one erroneous codeword group based on the identifier of the at least one erroneous codeword group, and encodes the at least one erroneous codeword group based on a second check matrix to obtain a sub check codeword.

The transmitting apparatus may determine, based on the identifier of the at least one erroneous codeword group, a specific codeword group that is in the initial codeword and in which the error occurs. After the transmitting apparatus obtains the at least one erroneous codeword group, because the at least one erroneous codeword group is not the complete initial codeword, the transmitting apparatus encodes the at least one erroneous codeword group by using the second check matrix that is agreed on. In this embodiment of the present invention, an encoding manner for encoding the codeword group may be an incremental redundancy-low density parity check (IR-LDPC) encoding manner. For example, as shown in step ⑤ in FIG. 2, the transmitting apparatus performs IR-LDPC encoding on the at least one erroneous codeword group to obtain an incremental redundancy-low density parity check forward error correction (IR-LDPC FEC) codeword, namely the sub check codeword.

105. The transmitting apparatus sends a second data frame including a partial sub check codeword to the receiving apparatus, where the partial sub check codeword is a part of the sub check codeword.

For example, the sending the second data frame is targeted data retransmission when a transmission error occurs in the first data frame sent in step 101. To effectively reduce a data amount of retransmitted data, on the premise that the receiving apparatus can correctly perform decoding, after the sub check codeword is obtained through encoding the at least one erroneous codeword group, there is no need to use the complete sub check codeword as retransmission data and transmit the sub check codeword to the receiving apparatus. Instead, only a part of the sub check codeword, namely the partial sub check codeword, is used as the retransmission data and is transmitted to the receiving apparatus. It can be learned that compared with the conventional manner, a data amount of retransmitted data is greatly reduced, and retransmission efficiency is improved.

When the at least one erroneous codeword group is specifically one erroneous codeword group, the at least one erroneous codeword group includes a first codeword group, the partial sub check codeword includes a first partial sub check codeword, the sub check codeword includes a first sub check codeword, the first partial sub check codeword is a part of the first sub check codeword, and the first sub check codeword is obtained after the first codeword group is encoded by using the second check matrix.

When the at least one erroneous codeword group is specifically n (n>2) erroneous codeword groups, usually each erroneous codeword group is encoded based on the second check matrix in an encoding process. One corresponding sub check codeword may be obtained after one erroneous codeword group is encoded, and n corresponding sub check codewords may be obtained after the n erroneous codeword groups are encoded.

In an example of a smallest combination of the n erroneous codeword groups, namely two erroneous codeword groups, the at least one erroneous codeword group includes a first codeword group and a second codeword group, the partial sub check codeword includes a first partial sub check codeword and a second partial sub check codeword, the sub check codeword includes a first sub check codeword and a second sub check codeword, the first partial sub check codeword is a part of the first sub check codeword, the second partial sub check codeword is a part of the second sub check codeword, the first sub check codeword is obtained after the first codeword group is encoded by using the second check matrix, and the second sub check codeword is obtained after the second codeword group is encoded by using the second check matrix. In this specification, a part of a codeword is a proper subset of all bits of the codeword. For example, the first partial sub check codeword may be a proper subset of the first sub check codeword, and the second partial sub check codeword may be a proper subset of the second sub check codeword.

It should be noted that regardless of a specific quantity of the at least one erroneous codeword group, a proportion of the partial sub check codeword in the sub check codeword may be negotiated or agreed on in advance by the transmitting apparatus and the receiving apparatus. In other words, a proportion of the first partial sub check codeword in the first sub check codeword is the same as a proportion of the second partial sub check codeword in the second sub check codeword. For example, for an erroneous codeword group, a sub check codeword obtained after the transmitting apparatus encodes the erroneous codeword group by using the second check matrix has 400 bits, and the transmitting apparatus may use 100-bit content as a partial sub check codeword of the sub check codeword and send the partial sub check codeword to the receiving apparatus. In the example, a proportion of the partial sub check codeword in the sub check codeword is ¼.

For an implementation of step 105, refer to step ⑥ in FIG. 2. The content retransmitted in step ⑥ is a part of the "IR-LDPC FEC" codeword, namely "partial IR-LDPC FEC", rather than the "IR-LDPC FEC" codeword obtained through encoding in step ⑤. In FIG. 2, "partial IR-LDPC FEC" may be a proper subset of "IR-LDPC FEC". The receiving apparatus receives the partial sub check codeword after data retransmission in step ⑥.

106. The receiving apparatus decodes the partial sub check codeword, the initial codeword, and the check codeword by using a third check matrix, to obtain the initial codeword, where the third check matrix is obtained based on the first check matrix, the second check matrix, and a location of the at least one erroneous codeword group in the initial codeword.

For example, because the transmitting apparatus sends only a part of the sub check codeword, the receiving apparatus cannot complete decoding directly based on the partial sub check codeword to obtain the correct initial codeword. Therefore, when receiving the partial sub check codeword, the receiving apparatus needs to combine the partial sub check codeword with the initial codeword and the check codeword that are received in step 101. For example, the receiving apparatus may concatenate the partial sub check codeword to an end of the initial codeword and the check codeword to form a long codeword, and decode the long codeword by using the third check matrix, to obtain the correct initial codeword with no transmission error. For a manner of concatenating the partial sub check codeword to an end of the initial codeword and the check codeword, refer to a data structure including "BBFRAME"+"LDPC FEC"+ "partial IR-LDPC FEC" shown in FIG. 2.

A decoding manner in which the receiving apparatus decodes the partial sub check codeword, the initial codeword, and the check codeword may be an IR-LDPC decoding manner. For example, the receiving apparatus performs IR-LDPC decoding on the data structure including "BBFRAME"+"LDPC FEC"+"partial IR-LDPC FEC" in step ⑦ shown in FIG. 2.

The third check matrix may be determined and obtained by the receiving apparatus based on the first check matrix, the second check matrix, and the location of the at least one erroneous codeword group in the initial codeword. Alternatively, the third check matrix may be determined and obtained by another device, and the receiving apparatus directly obtains the third check matrix from the another device.

A time at which the receiving apparatus obtains the third check matrix is not limited in the present invention. For example, the receiving apparatus may obtain the third check matrix after receiving the partial sub check codeword. Alternatively, the receiving apparatus may obtain the third check matrix before receiving the partial sub check codeword. Alternatively, when the initial codeword includes a relatively small quantity of codeword groups, the receiving apparatus may obtain, through negotiation with the transmitting apparatus in advance, the third check matrix before the transmitting apparatus sends the initial codeword.

It can be learned from the embodiment that when receiving the first data frame sent by the transmitting apparatus, the receiving apparatus may return the error indication information including the identifier of the at least one erroneous codeword group to the transmitting apparatus if it is found that an error occurs in the initial codeword of the first data frame. When receiving the partial sub check codeword retransmitted by the transmitting apparatus, the receiving apparatus may obtain the third check matrix based on the first check matrix, the second check matrix, and the location of the at least one erroneous codeword group in the initial codeword, and re-decode the retransmitted partial sub check codeword and content of the first data frame together based on the third check matrix, so as to obtain the correct initial codeword. It can be learned that on the premise of implementing correct decoding of an erroneous part, a data amount of retransmitted data can be reduced, and data retransmission efficiency is improved.

It should be noted that the third check codeword is not obtained through random concatenation and superposition of the first check matrix and the second check matrix. The third check matrix is constructed based on not only the first check matrix and the second check matrix, but a location relationship in which the first check matrix and the second check matrix are concatenated depends on the location of the at least one erroneous codeword group in the initial codeword. How to tailor the first check matrix and the second check matrix that are concatenated needs to be determined based on the proportion of the partial sub check codeword in the sub check codeword. To be specific, optionally, the third check matrix is obtained by tailoring the first check matrix and the second check matrix that are concatenated; in the third check matrix, a concatenation relationship between a remaining part of the second check matrix after tailoring and the first check matrix is related to the location of the at least one erroneous codeword group in the initial codeword; and a proportion of the remaining part of the second check matrix after tailoring in the second check matrix is related to a proportion of the partial sub check codeword in the sub check codeword.

In this specification, concatenation between matrices means that two matrices are connected and abut against each other, and content and arrangement of elements in the two matrices are not changed due to concatenation or through concatenation. The elements in the two matrices that are concatenated do not overlap. In addition, in the concatenated matrix obtained after the two matrices are concatenated, a smallest row number of one matrix in the concatenated matrix is equal to a largest row number of the other matrix in the concatenated matrix plus 1. Other areas, other than the two matrices, in the concatenated matrix obtained are all filled with zero matrices. Tailoring of an N×M matrix means accumulating rows and columns to be tailored starting from an element in the upper left corner of the N×M matrix based on a quantity of rows X and a quantity of columns Y to be tailored, and tailoring and obtaining, from the N×M matrix, elements in first X rows and first Y columns of the N×M matrix to form a new X×Y matrix. Content of an element A in row x and column y in the X×Y matrix is the same as content of an element in row x and column y in the N×M matrix.

For example, the remaining part of the second check matrix after tailoring may include a remaining part of the original second check matrix that is included in the third check matrix and obtained after tailoring.

Manners of tailoring and constructing the third check matrix are different based on different quantities of the at least one erroneous codeword group. Before specific tailoring and construction manners provided in the present invention are described, composition forms of the first check matrix and the second check matrix are first described.

The first check matrix includes a sparse matrix and a lower triangular matrix disposed on the right of the sparse matrix. A quantity of columns of the sparse matrix of the first check matrix is the same as a data amount of the initial codeword. For example, if the data amount of the initial codeword sent by the transmitting apparatus to the receiving apparatus is 4000 bits (unit: bit), the quantity of columns of the sparse matrix of the first check matrix may be 4000. In an encoding process, the sparse matrix of the first check matrix may be sequentially filled with data in the initial codeword, and then the data is encoded to generate the check codeword.

The lower triangular matrix of the first check matrix is a square matrix, and a quantity of rows and a quantity of columns are both the same as a data amount of the check codeword (which is obtained after the initial codeword is encoded by using the first check matrix). For example, if a data amount of the initial codeword is 4000 bits, usually the data amount of the check codeword obtained through encoding may be 4000 bits, and both the quantity of rows and the quantity of columns of the lower triangular matrix of the first check matrix may be 4000.

Figure 3A:
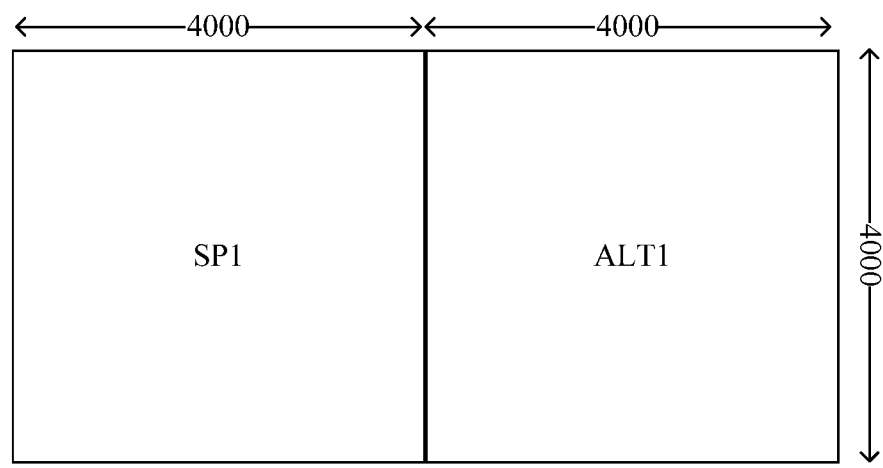
FIG. 3a is a diagram of a data structure of a first check matrix according to an embodiment of the present invention.

Data composition of the first check matrix may be expressed by using Expression 1: $H_1 = [SP_1 | ALT_1]$. $H_1$ is the first check matrix, $SP_1$ is the sparse matrix of the first check matrix, and $ALT_1$ is the lower triangular matrix of the first check matrix. It can be learned from the foregoing Expression 1 that in the data structure of $H_1$, $ALT_1$ is located on the right of $SP_1$. For a specific location relationship of the matrices of the first check matrix, refer to FIG. 3a. FIG. 3a shows a possible data structure of the first check matrix. A size of the first check matrix is 4000×8000. A size of the sparse matrix (SP1) of the first check matrix is 4000×4000. A size of the lower triangular matrix (ALT1) of the first check matrix is 4000×4000.

When the initial codeword is 4000 bits, if the transmitting apparatus encodes the initial codeword by using the first check matrix shown in FIG. 3a, a check codeword with 4000 bits may be obtained.

The second check matrix also includes a sparse matrix and a lower triangular matrix disposed on the right of the sparse matrix. A quantity of columns of the sparse matrix of the second check matrix is the same as a data amount of the codeword group. For example, if a data amount of each codeword group of the initial codeword is 100 bits, the quantity of columns of the sparse matrix of the second check matrix may be 100. In an encoding process, the sparse matrix of the second check matrix may be sequentially filled with data in a codeword group, and then the data is encoded to generate a sub check codeword corresponding to the codeword group.

The lower triangular matrix of the second check matrix is a square matrix, and a quantity of rows and a quantity of columns are both the same as a data amount of the sub check codeword (which is obtained after the codeword group is encoded by using the second check matrix). For example, if a data amount of a codeword group is 100 bits, usually a data amount of a sub check codeword obtained through encoding may be 400 bits, and both the quantity of rows and the quantity of columns of the lower triangular matrix of the second check matrix may be 400.

Figure 3B:
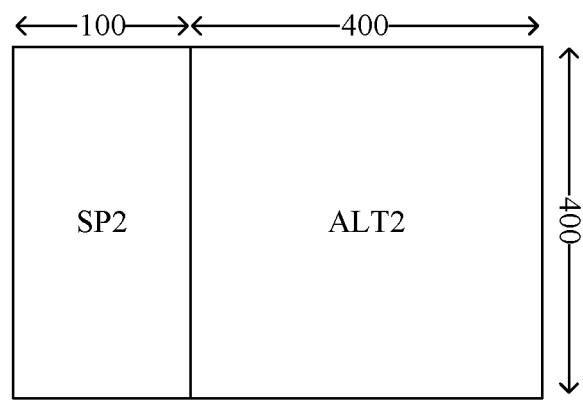
FIG. 3b is a diagram of a data structure of a second check matrix according to an embodiment of the present invention.

Data composition of the second check matrix may be expressed by using Expression 2: $H_2 = [SP_2 | ALT_2]$. $H_2$ is the second check matrix, $SP_2$ is the sparse matrix of the second check matrix, and $ALT_2$ is the lower triangular matrix of the second check matrix. It can be learned from the foregoing Expression 2 that in the data structure of $H_2$, $ALT_2$ is located on the right of $SP_2$. For a specific location relationship of the matrices of the second check matrix, refer to FIG. 3b. FIG. 3b shows a possible data structure of the second check matrix. A size of the second check matrix is 400×500. A size of the sparse matrix (SP2) of the second check matrix is 400×100. A size of the lower triangular matrix (ALT2) of the second check matrix is 400×400.

When a codeword group is 100 bits, if the transmitting apparatus encodes the codeword group by using the second check matrix shown in FIG. 3b, a sub check codeword with 400 bits may be obtained.

It should be clarified that in this embodiment of the present invention, the sparse matrix of the first check matrix and the sparse matrix of the second check matrix can be understood as a sparse matrix in a conventional sense. In other words, element arrangements in the first check matrix and the second check matrix may conform to a definition of a conventional sparse matrix. Likewise, element arrangements in the lower triangular matrix of the first check matrix and the lower triangular matrix of the second check matrix may also conform to a definition of a conventional lower triangular matrix.

Although the third check matrix also includes a sparse matrix and a lower triangular matrix according to definitions of names in this embodiment of the present invention, because the third check matrix is a matrix obtained by tailoring, the sparse matrix of the third check matrix may be understood as only a definition of a name, and an element arrangement in the sparse matrix of the third check matrix may not conform to the definition of the conventional sparse matrix. Likewise, an element arrangement in the lower triangular matrix of the third check matrix may not conform to the definition of the conventional lower triangular matrix either.

In the following third specific manner of obtaining the third check matrix, a concept of an intermediate matrix is further involved. Similar to the third check matrix, the intermediate matrix is also a matrix obtained by tailoring. Therefore, for descriptions of a sparse matrix and a lower triangular matrix of the intermediate matrix, refer to the foregoing description of the third check matrix.

This embodiment of the present invention provides at least three specific manners of constructing the third check matrix by tailoring. The specific manners are described in detail in the following.

First specific manner of obtaining the third check matrix:

In this manner, the at least one erroneous codeword group includes only the first codeword group. In other words, there is only one erroneous codeword group.

First, the first check matrix and the second check matrix need to be concatenated. In the first check matrix and the second check matrix that are concatenated, a row number of a first row of the lower triangular matrix of the second check matrix is a row number of a last row of the first check matrix plus 1, and a column number of a first column of the lower triangular matrix of the second check matrix is a column number of a last column of the first check matrix plus 1. In other words, in a matrix obtained after the concatenation, the lower triangular matrix of the first check matrix is in contact with the lower triangular matrix of the second check matrix, but none of the rows or columns in the lower triangular matrix of the second check matrix include an element in the lower triangular matrix of the first check matrix.

Figure 4A:
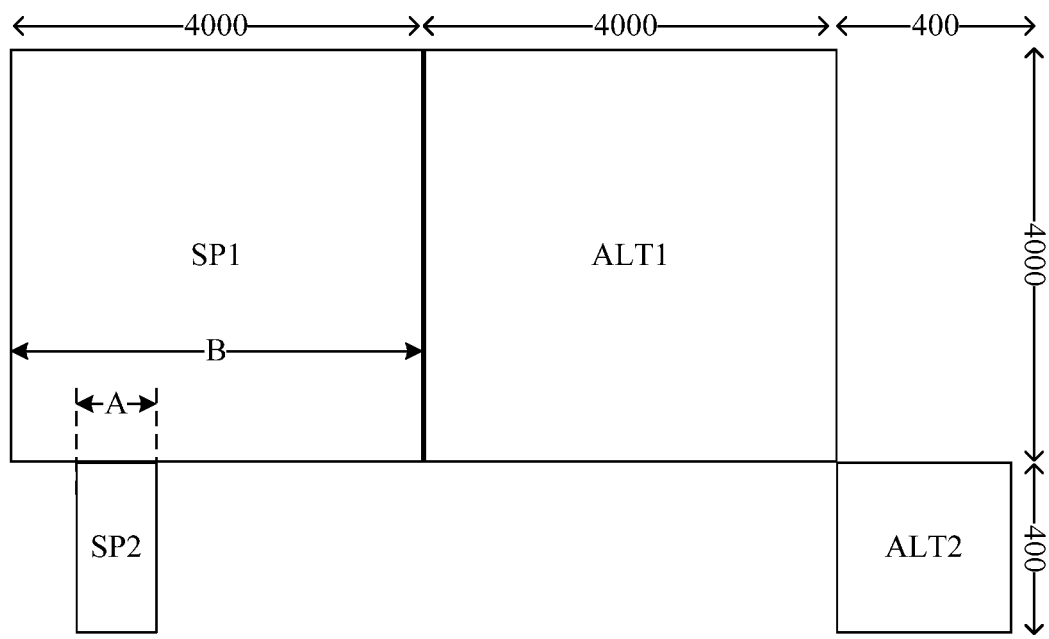
FIG. 4a is a schematic structural diagram of a matrix obtained after a first check matrix and a second check matrix are concatenated according to an embodiment of the present invention.

For a concatenation manner, refer to FIG. 4a. FIG. 4a shows concatenation of the first check matrix shown in FIG. 3a and the second check matrix shown in FIG. 3b. It should be noted that, for clarity, sizes of the first check matrix and the second check matrix in FIG. 4a and a ratio of the first check matrix to the second check matrix are not indicated based on the data shown in the figure, but the second check matrix is zoomed in for display. It can be learned that in the matrix obtained after the concatenation shown in FIG. 4a, ALT1 and ALT2 are concatenated diagonally. Row 4000 of the matrix obtained after the concatenation is a last row of ALT1, and row 4001 is a first row of ALT2. Column 8000 of the matrix obtained after the concatenation is a last column of ALT1, and column 8001 is a first column of ALT2.

The concatenation relationship between the remaining part of the second check matrix after tailoring and the first check matrix is related to the location of the at least one erroneous codeword group in the initial codeword. Optionally, the first specific manner of obtaining the third check matrix includes: The sparse matrix of the second check matrix is concatenated at the bottom of the sparse matrix of the first check matrix, and a concatenation location is consistent with a location of the first codeword group in the initial codeword.

To be specific, if the initial codeword is sequentially divided into 10 codeword groups, and codeword group 1 (that is, the first codeword group) is an erroneous codeword group, because the sparse matrix of the first check matrix needs to be sequentially filled with data in the initial codeword in an encoding process as described above, the sparse matrix of the second check matrix is concatenated below a location of codeword group 1 carried in the sparse matrix of the first check matrix. In the matrix obtained after the concatenation, a range of row numbers of the sparse matrix of the second check matrix is the same as that of the lower triangular matrix of the second check matrix.

For a manner of concatenating the sparse matrices of the two check matrices, further refer to FIG. 4a. In FIG. 4a, SP1 carries the data of the initial codeword (which is equivalent to location B), and data of the first codeword group carried in SP1 is located at location A. Therefore, SP2 is concatenated below location A in SP1.

A quantity of rows and a quantity of columns of the matrix obtained after the first check matrix and the second check matrix are concatenated amount to a quantity of rows and a quantity of columns of the first check matrix plus the quantity of rows and the quantity of columns of the lower triangular matrix of the second check matrix respectively. FIG. 4a is used as an example. The first check matrix is 4000×8000, the second check matrix is 400×500 (the lower triangular matrix of the second check matrix is 400×400), and the matrix obtained after the concatenation is 4400×8400. This means that the quantity of rows and the quantity of columns are separately increased by 400 (the quantity of rows and the quantity of columns of the lower triangular matrix of the second check matrix).

Other parts, other than the sparse matrix and the lower triangular matrix of the first check matrix and the sparse matrix and the lower triangular matrix of the second check matrix, in the first check matrix and the second check matrix that are concatenated are all zero matrices. Data composition of the first check matrix and the second check matrix that are concatenated may be expressed by using Expression 3:

$$H_3 = Com(H_1, H_2) = \begin{bmatrix} SP_1 & & ALT_1 & Z \\ Z & SP_2 & Z & & Z & ALT_2 \end{bmatrix}.$$

$H_3$ is the first check matrix and the second check matrix that are concatenated, Z is a zero matrix, Com ( ) may be understood as matrix concatenation or matrix combination. FIG. 4a is used as an example. The matrix obtained after the concatenation shown in FIG. 4a is 4400×8400, and other parts, other than SP1, SP2, ALT1, and ALT2, in the matrix obtained after the concatenation are all zero matrices.

When an error occurs in the first codeword group, the transmitting apparatus does not send, to the receiving apparatus, the entire first sub check codeword obtained after the first codeword group is encoded, but sends a part of the first sub check codeword: the first partial sub check codeword to the receiving apparatus. If the receiving apparatus directly uses the first check matrix and the second check matrix that are concatenated, it is difficult to perform correct decoding.

Therefore, the first check matrix and the second check matrix that are concatenated need to be tailored to obtain the third check matrix. The third check matrix also includes a sparse matrix and a lower triangular matrix. The sparse matrix of the third check matrix includes the sparse matrix of the first check matrix and a part of the sparse matrix of the second check matrix, and the lower triangular matrix of the third check matrix includes the lower triangular matrix of the first check matrix and a part of the lower triangular matrix of the second check matrix.

It can be learned that the entire sparse matrix and the entire lower triangular matrix of the first check matrix are included in the third check matrix, and only a part of the content of the second check matrix is included in the third check matrix. How much content of the second check matrix is retained is specifically related to a proportion of the first partial sub check codeword in the first sub check codeword. In other words, a quantity of rows and a quantity of columns by which the first check matrix and the second check matrix that are concatenated are tailored are determined based on the proportion of the first partial sub check codeword in the first sub check codeword.

If the proportion of the first partial sub check codeword in the first sub check codeword is n %, and a bit quantity of the first sub check codeword is m, the quantity of rows by which the first check matrix and the second check matrix that are concatenated are tailored may be the quantity of rows of the first check matrix plus n %*m, and the quantity of columns by which the first check matrix and the second check matrix that are concatenated are tailored may be the quantity of columns of the first check matrix plus n %*m.

Figure 4B:
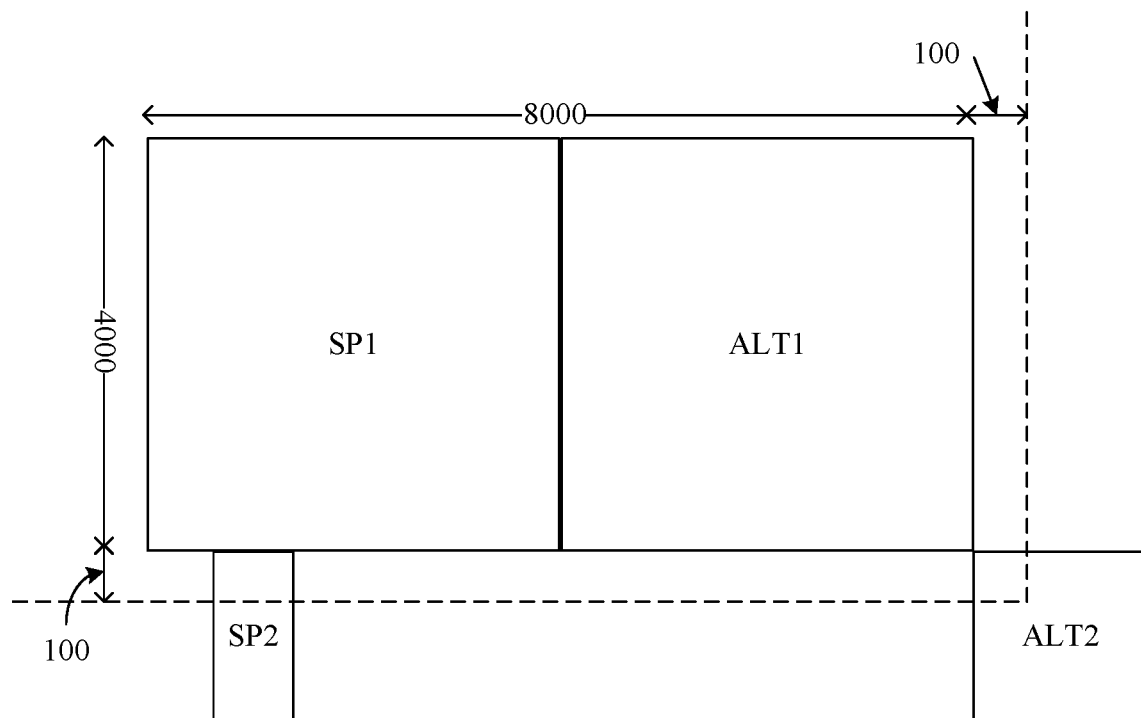
FIG. 4b is a schematic diagram of tailoring of the matrix obtained after concatenation shown in FIG. 4a according to an embodiment of the present invention.

Referring to FIG. 4b, FIG. 4b shows a process of tailoring the matrix obtained after the concatenation shown in FIG. 4a. In an application scenario of FIG. 4b, the first partial sub check codeword sent by the transmitting apparatus to the receiving apparatus is 100 bits, and the first sub check codeword is 400 bits. In other words, the proportion of the first partial sub check codeword in the first sub check codeword is 25%. In this case, it can be determined, based on the proportion of the first partial sub check codeword in the first sub check codeword, that the quantity of rows by which the first check matrix and the second check matrix that are concatenated are tailored is 4000+100=4100, where 4000 is the quantity of rows of SP1, and 100 is obtained after the quantity of rows of SP2 is multiplied by 25%. Likewise, the quantity of columns by which the first check matrix and the second check matrix that are concatenated are tailored is 8000+100=8100. A tailoring manner may be counting quantities of rows and columns to be tailored starting from the upper left corner of SP1. The 4100×8100 matrix enclosed by the dashed line in FIG. 4b is the third check matrix.

In the third check matrix, the remaining part of the second check matrix after tailoring includes a 100×100 partial SP2 and a 100×100 partial ALT2.

That a proportion of the remaining part of the second check matrix after tailoring in the second check matrix is related to a proportion of the partial sub check codeword in the sub check codeword includes:

a proportion of a remaining part of the lower triangular matrix of the second check matrix after tailoring in the lower triangular matrix of the second check matrix is equal to a square of the proportion of the first partial sub check codeword in the first sub check codeword.

FIG. 4b is used as an example. The proportion of the remaining part of the lower triangular matrix of the second check matrix after tailoring in the lower triangular matrix of the second check matrix is (100×100)/(400×400)=1/16. The square of the proportion of the first partial sub check codeword in the first sub check codeword is a square of (100/400), that is, 1/16.

The first partial sub check codeword, the initial codeword, and the check codeword can be decoded by using the third check matrix obtained in the first specific manner of obtaining the third check matrix, so as to obtain the correct initial codeword.

Second specific manner of obtaining the third check matrix:

In this manner, the at least one erroneous codeword group includes the first codeword group and the second codeword group. In other words, the second specific manner of obtaining the third check matrix is applied to a case of a plurality of erroneous codeword groups.

First, the first check matrix and the second check matrix need to be concatenated. In the first check matrix and the second check matrix that are concatenated, a row number of a first row of the lower triangular matrix of the second check matrix is a row number of a last row of the first check matrix plus 1, and a column number of a first column of the lower triangular matrix of the second check matrix is a column number of a last column of the first check matrix plus 1. In other words, in a matrix obtained after the concatenation, the lower triangular matrix of the first check matrix is in contact with the lower triangular matrix of the second check matrix, but none of the rows or columns in the lower triangular matrix of the second check matrix include an element in the lower triangular matrix of the first check matrix.

Figure 5A:
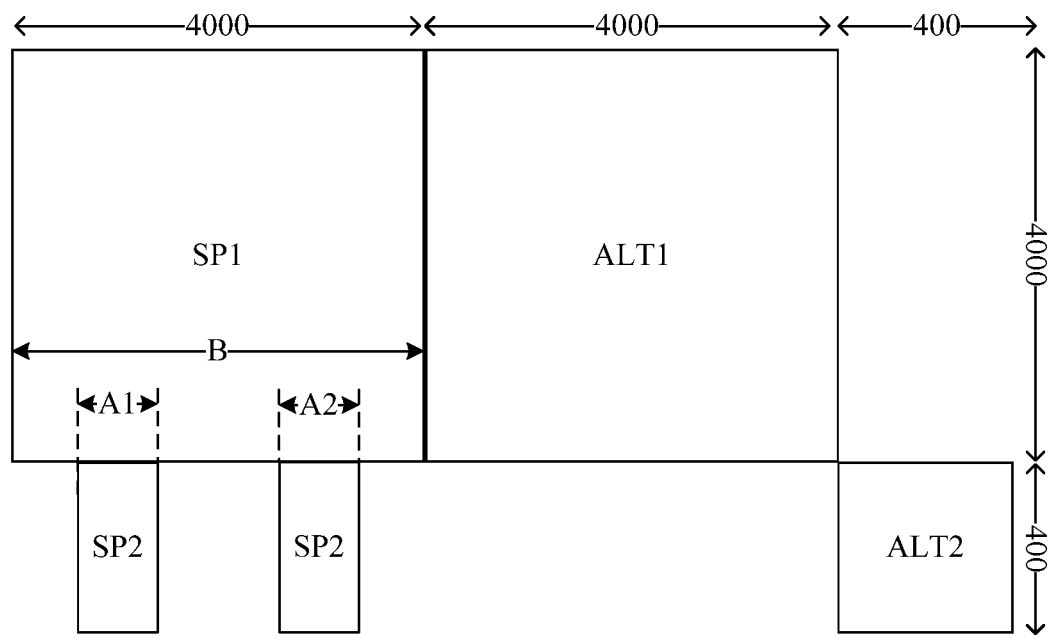
FIG. 5a is a schematic structural diagram of a matrix obtained after a first check matrix and a second check matrix are concatenated according to an embodiment of the present invention.

For a concatenation manner, refer to FIG. 5a. FIG. 5a shows concatenation of the first check matrix shown in FIG. 3a and the second check matrix shown in FIG. 3b. It should be noted that, for clarity, sizes of the first check matrix and the second check matrix in FIG. 5a and a ratio of the first check matrix to the second check matrix are not indicated based on the data shown in the figure, but the second check matrix is zoomed in for display. It can be learned that in the matrix obtained after the concatenation shown in FIG. 5a, ALT1 and ALT2 are concatenated diagonally. Row 4000 of the matrix obtained after the concatenation is a last row of ALT1, and row 4001 is a first row of ALT2. Column 8000 of the matrix obtained after the concatenation is a last column of ALT1, and column 8001 is a first column of ALT2.

The concatenation relationship between the remaining part of the second check matrix after tailoring and the first check matrix is related to the location of the at least one erroneous codeword group in the initial codeword. Optionally, the second specific manner of obtaining the third check matrix includes: Sparse matrices of the second check matrix are respectively concatenated at two locations below the sparse matrix of the first check matrix, a first concatenation location is consistent with a location of the first codeword group in the initial codeword, and a second concatenation location is consistent with a location of the second codeword group in the initial codeword.

For example, a quantity of sparse matrices of the second check matrix that are concatenated below the sparse matrix of the first check matrix is consistent with the quantity of the at least one erroneous codeword group. In addition, similar to the description in the first specific manner of obtaining the third check matrix, a sparse matrix of the second check matrix that corresponds to an erroneous codeword group is concatenated below a location at which the erroneous codeword group is carried in the sparse matrix of the first check matrix. In the matrix obtained after the concatenation, a range of row numbers of each sparse matrix of the second check matrix is the same as that of the lower triangular matrix of the second check matrix.

For a manner of concatenating the sparse matrices of the two check matrices, further refer to FIG. 5a. In FIG. 5a, SP1 carries the data of the initial codeword (which is equivalent to location B), and data of the first codeword group carried in SP1 is located at location A1. Therefore, SP2 corresponding to the first codeword group is concatenated below location A1 in SP1. In addition, data of the second codeword group carried in SP1 is located at location A2. Therefore, SP2 corresponding to the second codeword group is concatenated below location A2 in SP1.

A quantity of rows and a quantity of columns of the matrix obtained after the first check matrix and the second check matrix are concatenated amount to a quantity of rows and a quantity of columns of the first check matrix plus the quantity of rows and the quantity of columns of the lower triangular matrix of the second check matrix respectively. FIG. 4a is used as an example. The first check matrix is 4000×8000, the second check matrix is 400×500 (the lower triangular matrix of the second check matrix is 400×400), and the matrix obtained after the concatenation is 4400×8400. This means that the quantity of rows and the quantity of columns are separately increased by 400 (the quantity of rows and the quantity of columns of the lower triangular matrix of the second check matrix).

Other parts, other than the sparse matrix and the lower triangular matrix of the first check matrix and the sparse matrices and the lower triangular matrix of the second check matrix, in the first check matrix and the second check matrix that are concatenated are all zero matrices. For data composition of the first check matrix and the second check matrix that are concatenated, refer to Expression 3. A difference from Expression 3 lies in that there are a plurality of SP2. If the SP2 are not in contact, a part between the SP2 is a zero matrix. FIG. 5a is used as an example. The matrix obtained after the concatenation shown in FIG. 5a is 4400×8400, and other parts, other than SP1, two SP2, ALT1, and ALT2, in the matrix obtained after the concatenation are all zero matrices.

Because a part of the first sub check codeword and a part of the second sub check codeword are received by the receiving apparatus, if the receiving apparatus directly uses the first check matrix and the second check matrix that are concatenated, it is difficult to perform correct decoding.

Therefore, the first check matrix and the second check matrix that are concatenated need to be tailored to obtain the third check matrix. The third check matrix also includes a sparse matrix and a lower triangular matrix. The sparse matrix of the third check matrix includes the sparse matrix of the first check matrix and two parts of the sparse matrices of the second check matrix, and the lower triangular matrix of the third check matrix includes the lower triangular matrix of the first check matrix and a part of the lower triangular matrix of the second check matrix.

A quantity of rows and a quantity of columns by which the first check matrix and the second check matrix that are concatenated are tailored may be determined based on a proportion of the first partial sub check codeword in the first sub check codeword and a proportion of the second partial sub check codeword in the second sub check codeword.

If the proportion of the first partial sub check codeword in the first sub check codeword is n %, and a bit quantity of the first sub check codeword is m, the proportion of the second partial sub check codeword in the second sub check codeword may also be n %, and a bit quantity of the second sub check codeword is also m. In this case, the quantity of rows by which the first check matrix and the second check matrix that are concatenated are tailored may be the quantity of rows of the first check matrix plus (n %*m)*2, and the quantity of columns by which the first check matrix and the second check matrix that are concatenated are tailored may be the quantity of columns of the first check matrix plus (n %*m)*2.

Figure 5B:
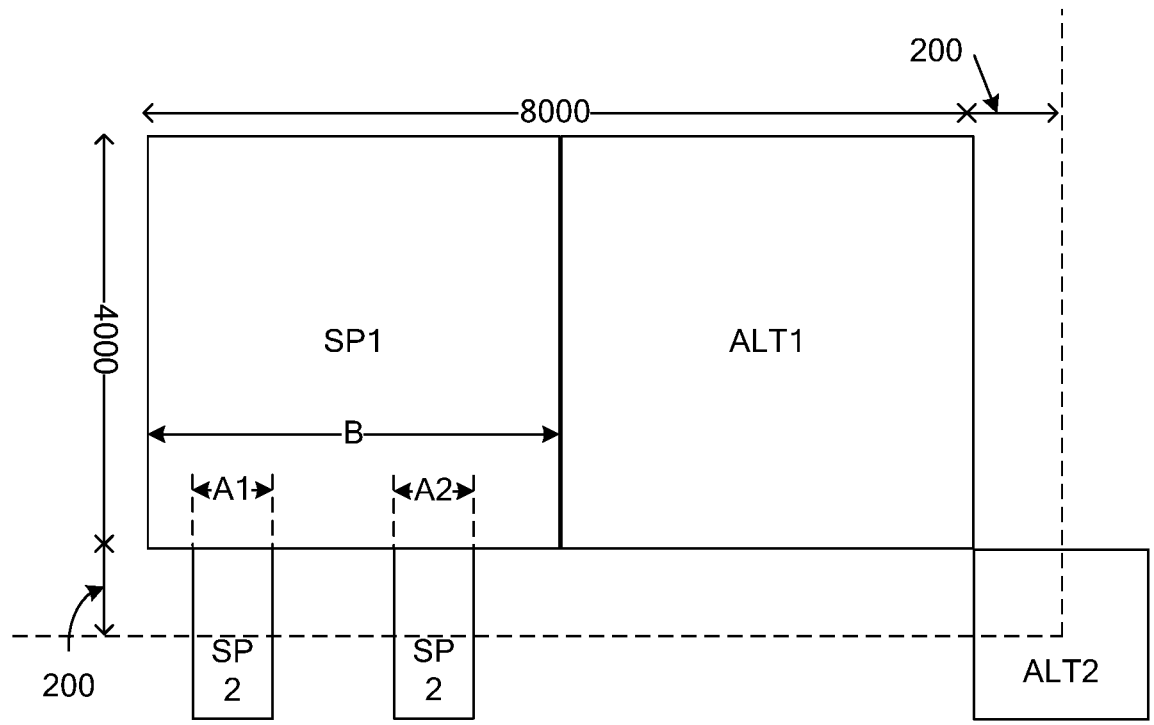
FIG. 5b is a schematic diagram of tailoring of the matrix obtained after concatenation shown in FIG. 5a according to an embodiment of the present invention.

Referring to FIG. 5b, FIG. 5b shows a process of tailoring the matrix obtained after the concatenation shown in FIG. 5a. In an application scenario of FIG. 5b, the first partial sub check codeword and the second partial sub check codeword that are sent by the transmitting apparatus to the receiving apparatus are both 100 bits, and the first sub check codeword and the second sub check codeword are both 400 bits. In other words, the proportion of the first partial sub check codeword in the first sub check codeword and the proportion of the second partial sub check codeword in the second sub check codeword are both 25%. In this case, it can be determined, based on the proportion of the first partial sub check codeword in the first sub check codeword and the proportion of the second partial sub check codeword in the second sub check codeword, that the quantity of rows by which the first check matrix and the second check matrix that are concatenated are tailored is 4000+100+100=4200, where 4000 is the quantity of rows of SP1, and 100 is obtained after the quantity of rows of SP2 is multiplied by 25%. Likewise, the quantity of columns by which the first check matrix and the second check matrix that are concatenated are tailored is 8000+100+100=8200. A tailoring manner may be counting quantities of rows and columns to be tailored starting from the upper left corner of SP1. The 4200×8200 matrix enclosed by the dashed line in FIG. 5b is the third check matrix.

In the third check matrix, the remaining part of the second check matrix after tailoring includes two 200×100 partial SP2 and a 200×200 partial ALT2.

That a proportion of the remaining part of the second check matrix after tailoring in the second check matrix is related to a proportion of the partial sub check codeword in the sub check codeword includes:

a proportion of a remaining part of the lower triangular matrix of the second check matrix after tailoring in the lower triangular matrix of the second check matrix is equal to a square of a sum of the proportion of the first partial sub check codeword in the first sub check codeword and the proportion of the second partial sub check codeword in the second sub check codeword.

FIG. 5b is used as an example. The proportion of the remaining part of the lower triangular matrix of the second check matrix after tailoring in the lower triangular matrix of the second check matrix is (200×200)/(400×400)=1/4. The proportion of the first partial sub check codeword in the first sub check codeword and the proportion of the second partial sub check codeword in the second sub check codeword are both 100/400=1/4. The square of the sum is a square of (1/4+1/4), that is, 1/4.

The first partial sub check codeword, the second partial sub check codeword, the initial codeword, and the check codeword can be decoded by using the third check matrix obtained in the second specific manner of obtaining the third check matrix, so as to obtain the correct initial codeword.

Third specific manner of obtaining the third check matrix:

In this manner, the at least one erroneous codeword group includes the first codeword group and the second codeword group. In other words, the third specific manner of obtaining the third check matrix is applied to a case of a plurality of erroneous codeword groups.

In the third specific manner of obtaining the third check matrix, matrix concatenation and tailoring need to be performed for a plurality of times. A quantity of times of matrix concatenation and tailoring is consistent with the quantity of the at least one erroneous codeword group. A case in which the at least one erroneous codeword group is specifically two erroneous codeword groups: the first codeword group and the second codeword group respectively is used for description in the following.

Matrix concatenation may be implemented for the first time based on the first codeword group, and the first check matrix and a second check matrix are concatenated. In the first check matrix and the second check matrix that are concatenated, a row number of a first row of a lower triangular matrix of the second check matrix is a row number of a last row of the first check matrix plus 1, and a column number of a first column of the lower triangular matrix of the second check matrix is a column number of a last column of the first check matrix plus 1. In other words, in a matrix obtained after the concatenation, the lower triangular matrix of the first check matrix is in contact with the lower triangular matrix of the second check matrix, but none of the rows or columns in the lower triangular matrix of the second check matrix include an element in the lower triangular matrix of the first check matrix.

Figure 6A:
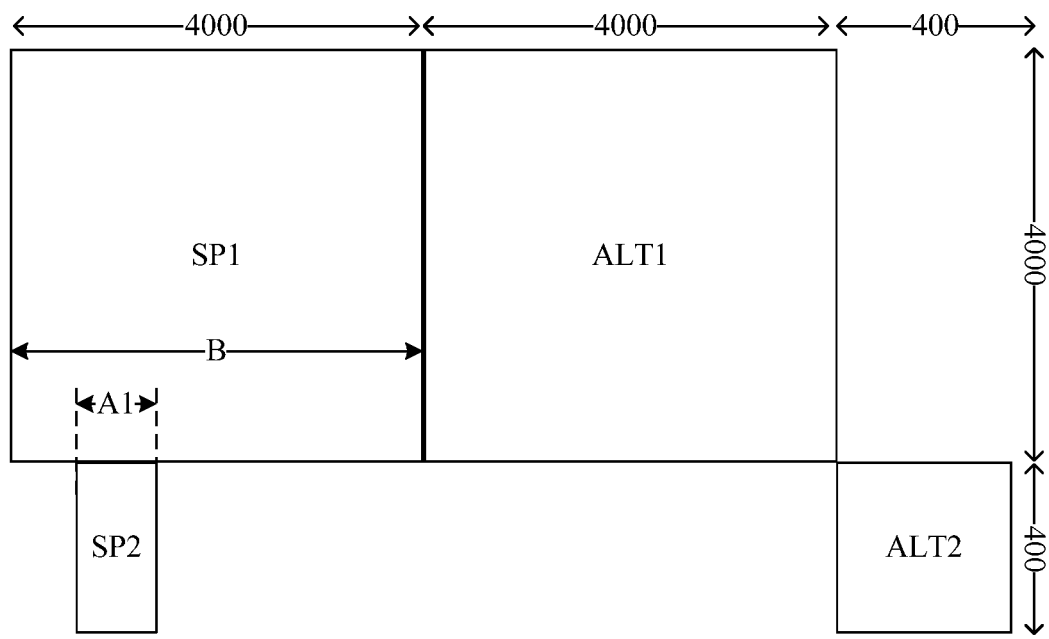
FIG. 6a is a schematic structural diagram of matrix concatenation for the first time according to an embodiment of the present invention.

For a concatenation manner, refer to FIG. 6a. FIG. 6a shows concatenation of the first check matrix shown in FIG. 3a and the second check matrix shown in FIG. 3b. It should be noted that, for clarity, sizes of the first check matrix and the second check matrix in FIG. 6a and a ratio of the first check matrix to the second check matrix are not indicated based on the data shown in the figure, but the second check matrix is zoomed in for display. It can be learned that in the matrix obtained after the concatenation shown in FIG. 6a, ALT1 and ALT2 are concatenated diagonally. Row 4000 of the matrix obtained after the concatenation is a last row of ALT1, and row 4001 is a first row of ALT2. Column 8000 of the matrix obtained after the concatenation is a last column of ALT1, and column 8001 is a first column of ALT2.

A sparse matrix of the second check matrix is concatenated at the bottom of the sparse matrix of the first check matrix, and a concatenation location is consistent with a location of the first codeword group in the initial codeword.

For example, similar to the description in the first specific manner of obtaining the third check matrix, the sparse matrix of the second check matrix that corresponds to the first codeword group is concatenated below a location at which the first codeword group is carried in the sparse matrix of the first check matrix. In the matrix obtained after the concatenation, a range of row numbers of the sparse matrix of the second check matrix is the same as that of the lower triangular matrix of the second check matrix.

For a manner of concatenating the sparse matrices of the two check matrices, further refer to FIG. 6a. In FIG. 6a, SP1 carries the data of the initial codeword (which is equivalent to location B), and data of the first codeword group carried in SP1 is located at location A1. Therefore, SP2 corresponding to the first codeword group is concatenated below location A1 in SP1.

A quantity of rows and a quantity of columns of the matrix obtained after the first check matrix and the second check matrix are concatenated amount to a quantity of rows and a quantity of columns of the first check matrix plus a quantity of rows and a quantity of columns of the lower triangular matrix of the second check matrix respectively. FIG. 6a is used as an example. The first check matrix is 4000×8000, the second check matrix is 400×500 (the lower triangular matrix of the second check matrix is 400×400), and the matrix obtained after the concatenation is 4400×8400. This means that the quantity of rows and the quantity of columns are separately increased by 400 (the quantity of rows and the quantity of columns of the lower triangular matrix of the second check matrix).

Other parts, other than the sparse matrix and the lower triangular matrix of the first check matrix and the sparse matrix and the lower triangular matrix of the second check matrix, in the first check matrix and the second check matrix that are concatenated are all zero matrices. Data composition of the first check matrix and the second check matrix that are concatenated may be expressed by using Expression 3. FIG. 6a is used as an example. The matrix obtained after the concatenation shown in FIG. 6a is 4400×8400, and other parts, other than SP1, SP2, ALT1, and ALT2, in the matrix obtained after the concatenation are all zero matrices.

Then tailoring is performed for the first time. The current tailoring is performed for the matrix obtained after the concatenation for the first time, to obtain an intermediate matrix. The intermediate matrix includes a sparse matrix and a lower triangular matrix.

A quantity of rows and a quantity of columns by which the first check matrix and the second check matrix that are concatenated are tailored are determined based on a proportion of the first partial sub check codeword in the first sub check codeword.

If the proportion of the first partial sub check codeword in the first sub check codeword is n %, and a bit quantity of the first sub check codeword is m, the quantity of rows by which the first check matrix and the second check matrix that are concatenated are tailored may be the quantity of rows of the first check matrix plus n %*m, and the quantity of columns by which the first check matrix and the second check matrix that are concatenated are tailored may be the quantity of columns of the first check matrix plus n %*m.

Figure 6B:
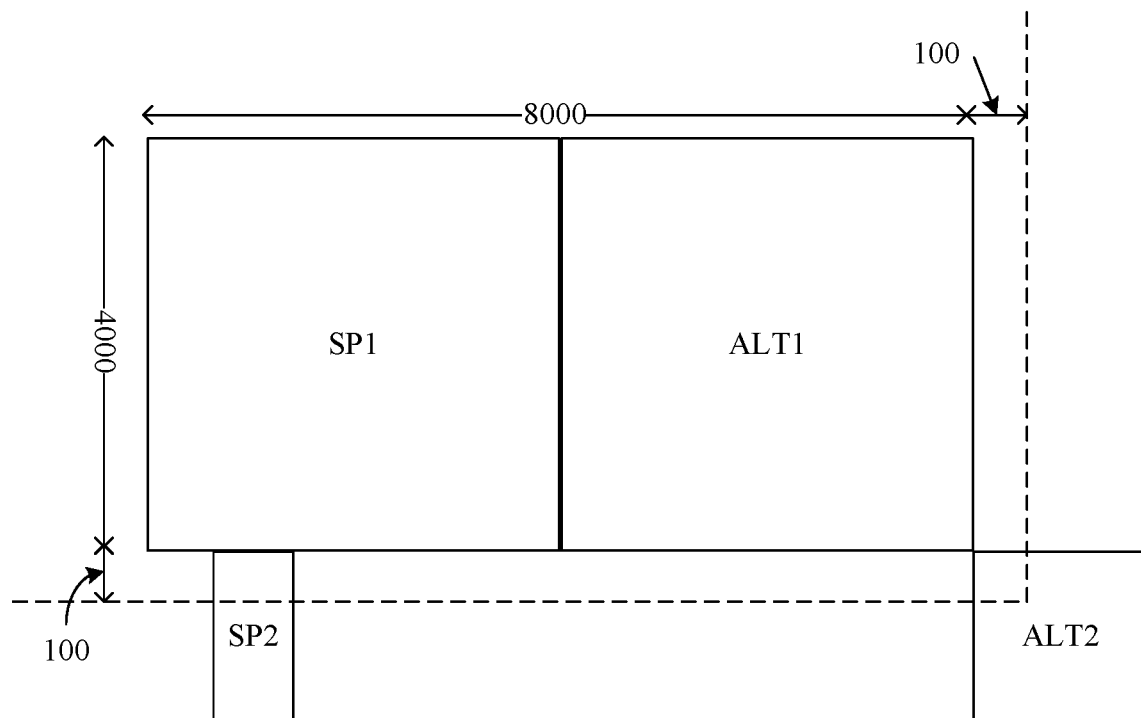
FIG. 6b is a schematic diagram of tailoring of the matrix obtained after concatenation shown in FIG. 6a according to an embodiment of the present invention.

Referring to FIG. 6b, FIG. 6b shows a process of tailoring the matrix obtained after the concatenation shown in FIG. 6a. In an application scenario of FIG. 6b, the first partial sub check codeword sent by the transmitting apparatus to the receiving apparatus is 100 bits, and the first sub check codeword is 400 bits. In other words, the proportion of the first partial sub check codeword in the first sub check codeword is 25%. In this case, it can be determined, based on the proportion of the first partial sub check codeword in the first sub check codeword, that the quantity of rows by which the first check matrix and the second check matrix that are concatenated are tailored is 4000+100=4100, where 4000 is the quantity of rows of SP1, and 100 is obtained after the quantity of rows of SP2 is multiplied by 25%. Likewise, the quantity of columns by which the first check matrix and the second check matrix that are concatenated are tailored is 8000+100=8100. A tailoring manner may be counting quantities of rows and columns to be tailored starting from the upper left corner of SP1. The 4100×8100 matrix enclosed by the dashed line in FIG. 6b is the intermediate matrix.

Figure 6C:
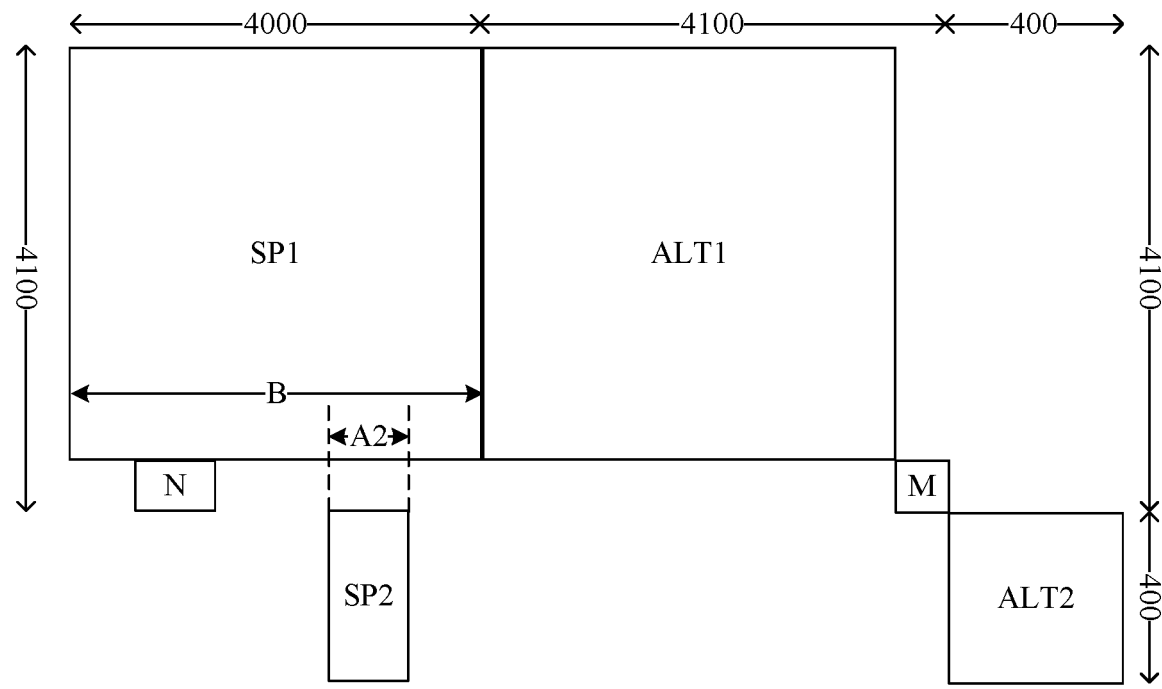
FIG. 6c is a schematic structural diagram of matrix concatenation for the second time according to an embodiment of the present invention.

In the intermediate matrix, a remaining part of the second check matrix after tailoring includes a 100×100 partial SP2 (this part is N in FIG. 6c) and a 100×100 partial ALT2 (this part is M in FIG. 6c).

Similar to the first specific manner of obtaining the third check matrix, a proportion of a remaining part of the lower triangular matrix of the second check matrix after tailoring in the lower triangular matrix of the second check matrix is equal to a square of the proportion of the first partial sub check codeword in the first sub check codeword. Details are not described herein again.

The sparse matrix of the intermediate matrix includes the sparse matrix of the first check matrix and a part of the sparse matrix of the second sparse matrix, and another part in the sparse matrix of the intermediate matrix is a zero matrix. The lower triangular matrix of the intermediate matrix includes the lower triangular matrix of the first check matrix and a part of the lower triangular matrix of the second sparse matrix, and another part in the lower triangular matrix of the intermediate matrix is a zero matrix.

FIG. 6c is used as an example. A size of the sparse matrix of the intermediate matrix is 4100×4000. The sparse matrix of the intermediate matrix includes the 4000×4000 sparse matrix of the first check matrix and 100×100 N (that is, the remaining partial SP2 of the second check matrix after the tailoring for the first time). Other parts are all zero matrices. A size of the lower triangular matrix of the intermediate matrix is 4100×4100. The lower triangular matrix of the intermediate matrix includes the 4000×4000 lower triangular matrix of the first check matrix and 100×100 M (that is, the remaining partial ALT2 of the second check matrix after the tailoring for the first time). Other parts are all zero matrices.

In the following, matrix concatenation and tailoring are performed for the intermediate matrix for the second time in the third specific manner of obtaining the third check matrix, to obtain the third check matrix.

Matrix concatenation may be implemented for the second time based on the second codeword group, and the intermediate matrix and a second check matrix are concatenated. In the intermediate matrix and the second check matrix that are concatenated, a row number of a first row of a lower triangular matrix of the second check matrix is a row number of a last row of the intermediate matrix plus 1, and a column number of a first column of the lower triangular matrix of the second check matrix is a column number of a last column of the intermediate matrix plus 1. In other words, in a matrix obtained after the concatenation, the lower triangular matrix of the intermediate matrix is in contact with the lower triangular matrix of the second check matrix, but none of the rows or columns in the lower triangular matrix of the second check matrix include an element in the lower triangular matrix of the intermediate matrix.

For a concatenation manner, refer to FIG. 6c. FIG. 6c shows concatenation of the intermediate matrix shown in FIG. 6b and the second check matrix shown in FIG. 3b. It should be noted that, for clarity, sizes of the intermediate matrix and the second check matrix in FIG. 6c and a ratio of the intermediate matrix to the second check matrix are not indicated based on the data shown in the figure, but the second check matrix is zoomed in for display. It can be learned that in the matrix obtained after the concatenation shown in FIG. 6c, the lower triangular matrix of the intermediate matrix and ALT2 are concatenated diagonally. Row 4100 of the matrix obtained after the concatenation is a last row of the lower triangular matrix of the intermediate matrix, and row 4101 is a first row of ALT2. Column 8100 of the matrix obtained after the concatenation is a last column of the lower triangular matrix of the intermediate matrix, and column 8101 is a first column of ALT2.

A sparse matrix of the second check matrix is concatenated at the bottom of the sparse matrix of the intermediate matrix, and a concatenation location is consistent with a location of the second codeword group in the initial codeword.

For example, similar to the description in the first specific manner of obtaining the third check matrix, the sparse matrix of the second check matrix that corresponds to the second codeword group is concatenated at the bottom of the sparse matrix of the intermediate matrix, and a specific range of column numbers of the sparse matrix of the second check matrix is consistent with a range of column numbers of the second codeword group carried in the sparse matrix of the first check matrix. In the matrix obtained after the concatenation, a range of row numbers of the sparse matrix of the second check matrix is the same as that of the lower triangular matrix of the second check matrix.

For a manner of concatenating the sparse matrices of the two check matrices, further refer to FIG. 6c. In FIG. 6c, SP1 carries the data of the initial codeword (which is equivalent to location B), and data of the first codeword group carried in SP1 is located at location A2. Therefore, SP2 corresponding to the first codeword group is concatenated at the bottom of the sparse matrix of the intermediate matrix, and a specific range of column numbers of SP2 is consistent with a range of column numbers of A2.

A quantity of rows and a quantity of columns of the matrix obtained after the intermediate matrix and the second check matrix are concatenated amount to a quantity of rows and a quantity of columns of the intermediate matrix plus a quantity of rows and a quantity of columns of the lower triangular matrix of the second check matrix respectively. FIG. 6c is used as an example. The intermediate matrix is 4100×8100, the second check matrix is 400×500 (the lower triangular matrix of the second check matrix is 400×400), and the matrix obtained after the concatenation is 4500×8500. This means that the quantity of rows and the quantity of columns are separately increased by 400 (the quantity of rows and the quantity of columns of the lower triangular matrix of the second check matrix).

Other parts, other than the sparse matrix and the lower triangular matrix of the intermediate matrix and the sparse matrix and the lower triangular matrix of the second check matrix, in the intermediate matrix and the second check matrix that are concatenated are all zero matrices. Data composition of the intermediate matrix and the second check matrix that are concatenated may be expressed by using Expression 4:

$$H_4 = Com(H_3, H_2) = \begin{bmatrix} SP_3 & & ALT_3 & Z \\ Z & SP_2 & Z & Z & ALT_2 \end{bmatrix}.$$

$H_4$ is the intermediate matrix and the second check matrix that are concatenated, $H_3$ is the intermediate matrix, $SP_3$ is the sparse matrix of the intermediate matrix, and $ALT_3$ is the lower triangular matrix of the intermediate matrix. FIG. 6c is used as an example. The matrix obtained after the concatenation shown in FIG. 6c is 4500×8500, and other parts, other than the sparse matrix of the intermediate matrix, SP2, the lower triangular matrix of the intermediate matrix, and ALT2, in the matrix obtained after the concatenation are all zero matrices.

Then tailoring is performed for the second time. The current tailoring is performed for the matrix obtained after the concatenation for the second time, to obtain the third check matrix. The third check matrix includes a sparse matrix and a lower triangular matrix disposed on the right of the sparse matrix. The sparse matrix of the third check matrix includes the sparse matrix of the intermediate matrix and a part of the sparse matrix of the second check matrix, and the lower triangular matrix of the third check matrix includes the lower triangular matrix of the intermediate matrix and a part of the lower triangular matrix of the second check matrix.

How much content of the second check matrix is retained during tailoring for the second time is specifically related to a proportion of the second partial sub check codeword in the second sub check codeword. In other words, a quantity of rows and a quantity of columns by which the intermediate matrix and the second check matrix that are concatenated are tailored are determined based on the proportion of the first partial sub check codeword in the first sub check codeword and the proportion of the second partial sub check codeword in the second sub check codeword.

If the proportion of the second partial sub check codeword in the second sub check codeword is n %, and a bit quantity of the second sub check codeword is m, the quantity of rows by which the intermediate matrix and the second check matrix that are concatenated are tailored may be the quantity of rows of the intermediate matrix plus n %*m, and the quantity of columns by which the intermediate matrix and the second check matrix that are concatenated are tailored may be the quantity of columns of the intermediate matrix plus n %*m.

Figure 6D:
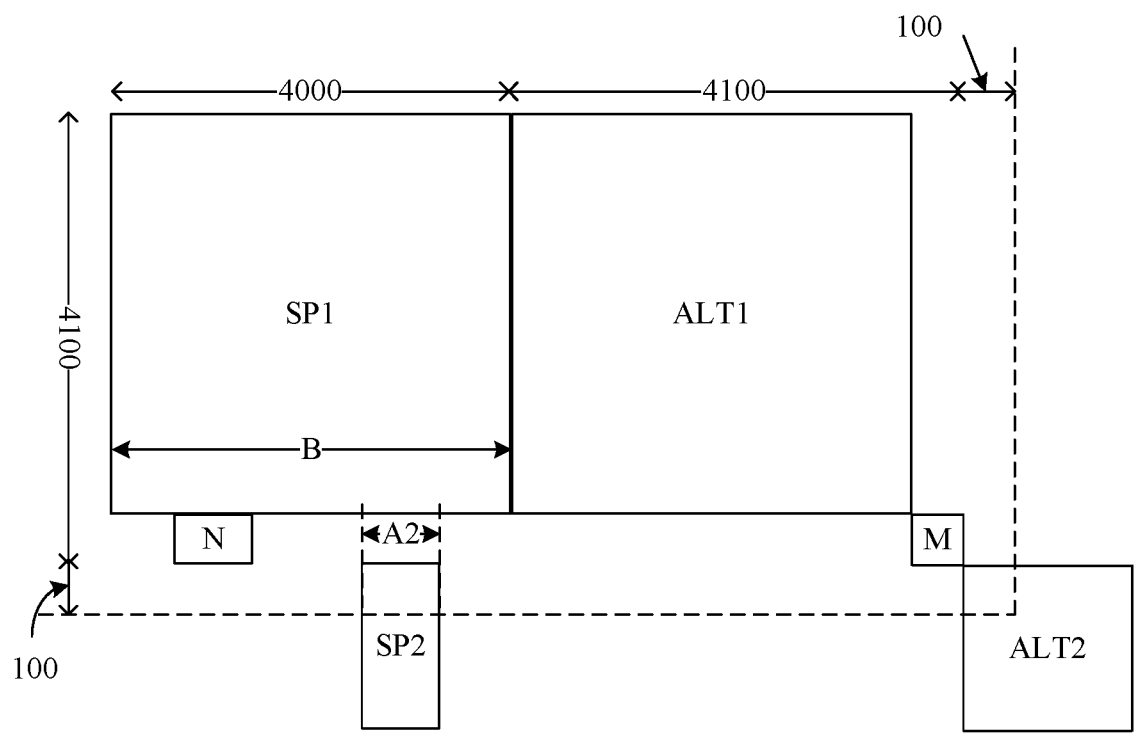
FIG. 6d is a schematic diagram of tailoring of the matrix obtained after concatenation shown in FIG. 6c according to an embodiment of the present invention.

Referring to FIG. 6d, FIG. 6d shows a process of tailoring the matrix obtained after the concatenation shown in FIG. 6c. In an application scenario of FIG. 6d, the second partial sub check codeword sent by the transmitting apparatus to the receiving apparatus is 100 bits, and the second sub check codeword is 400 bits. In other words, the proportion of the second partial sub check codeword in the second sub check codeword is 25%. In this case, it can be determined, based on the proportion of the second partial sub check codeword in the second sub check codeword, that the quantity of rows by which the intermediate matrix and the second check matrix that are concatenated are tailored is 4100+100=4200, where 4100 is the quantity of rows of the intermediate matrix, and 100 is obtained after the quantity of rows of SP2 is multiplied by 25%. Likewise, the quantity of columns by which the intermediate matrix and the second check matrix that are concatenated are tailored is 8100+100=8200. A tailoring manner may be counting quantities of rows and columns to be tailored starting from the upper left corner of SP1. The 4200×8200 matrix enclosed by the dashed line in FIG. 6d is the third check matrix.

In the third check matrix, the remaining part of the second check matrix after tailoring includes a 100×100 partial SP2 and a 100×100 partial ALT2.

Similar to the first specific manner of obtaining the third check matrix, a proportion of a remaining part of the lower triangular matrix of the second check matrix after tailoring in the lower triangular matrix of the second check matrix is equal to a square of the proportion of the second partial sub check codeword in the second sub check codeword. Details are not described herein again.

The first partial sub check codeword, the second partial sub check codeword, the initial codeword, and the check codeword can be decoded by using the third check matrix obtained in the third specific manner of obtaining the third check matrix, so as to obtain the correct initial codeword.

Figure 7:
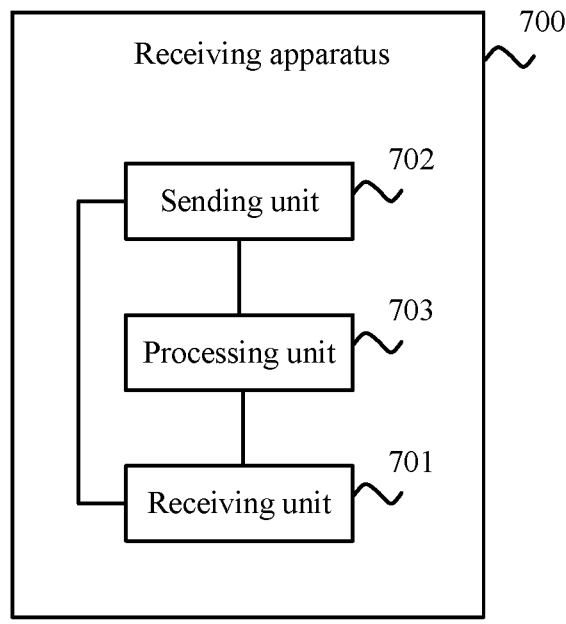
FIG. 7 is a diagram of an apparatus structure of a receiving apparatus according to an embodiment of the present invention.

FIG. 7 is a diagram of an apparatus structure of a receiving apparatus according to an embodiment of the present invention. The receiving apparatus 700 includes a receiving unit 701, a sending unit 702, and a processing unit 703.

The receiving unit 701 is configured to receive a first data frame sent by a transmitting apparatus, where the first data frame includes an initial codeword and a check codeword, the check codeword is obtained after the initial codeword is encoded based on a first check matrix, and the initial codeword has a plurality of codeword groups.

For specific descriptions of this part, refer to related descriptions of step 101 in the embodiment corresponding to FIG. 1. Details are not described herein again.

The processing unit 703 is configured to recognize at least one erroneous codeword group in the initial codeword.

For specific descriptions of this part, refer to related descriptions of step 102 in the embodiment corresponding to FIG. 1. Details are not described herein again.

The sending unit 702 is configured to send an error indication message to the transmitting apparatus, where the error indication message carries an identifier of the at least one erroneous codeword group.

For specific descriptions of this part, refer to related descriptions of step 103 in the embodiment corresponding to FIG. 1. Details are not described herein again.

The receiving unit 701 is further configured to obtain a second data frame sent by the transmitting apparatus based on the error indication message, where the second data frame includes a partial sub check codeword, the partial sub check codeword is a part of a sub check codeword, and the sub check codeword is obtained after the at least one erroneous codeword group is encoded by using a second check matrix.

For specific descriptions of this part, refer to related descriptions of step 105 in the embodiment corresponding to FIG. 1. Details are not described herein again.

The processing unit 703 is further configured to decode the partial sub check codeword, the initial codeword, and the check codeword by using a third check matrix, to obtain the initial codeword, where the third check matrix is obtained based on the first check matrix, the second check matrix, and a location of the at least one erroneous codeword group in the initial codeword.

For specific descriptions of this part, refer to related descriptions of step 106 in the embodiment corresponding to FIG. 1. Details are not described herein again.

It can be learned that when receiving the first data frame sent by the transmitting apparatus, the receiving apparatus may return the error indication information including the identifier of the at least one erroneous codeword group to the transmitting apparatus if it is found that an error occurs in the initial codeword of the first data frame. When receiving the partial sub check codeword retransmitted by the transmitting apparatus, the receiving apparatus may obtain the third check matrix based on the first check matrix, the second check matrix, and the location of the at least one erroneous codeword group in the initial codeword, and re-decode the retransmitted partial sub check codeword and content of the first data frame together based on the third check matrix, so as to obtain the correct initial codeword. It can be learned that on the premise of implementing correct decoding of an erroneous part, a data amount of retransmitted data can be reduced, and data retransmission efficiency is improved.

Optionally, the at least one erroneous codeword group includes a first codeword group, the partial sub check codeword includes a first partial sub check codeword, the sub check codeword includes a first sub check codeword, the first partial sub check codeword is a part of the first sub check codeword, and the first sub check codeword is obtained after the first codeword group is encoded by using the second check matrix.

For specific descriptions of this part, refer to related descriptions of step 105 in the embodiment corresponding to FIG. 1. Details are not described herein again.

Optionally, the at least one erroneous codeword group includes a first codeword group and a second codeword group, the partial sub check codeword includes a first partial sub check codeword and a second partial sub check codeword, the sub check codeword includes a first sub check codeword and a second sub check codeword, the first partial sub check codeword is a part of the first sub check codeword, the second partial sub check codeword is a part of the second sub check codeword, the first sub check codeword is obtained after the first codeword group is encoded by using the second check matrix, and the second sub check codeword is obtained after the second codeword group is encoded by using the second check matrix.

For specific descriptions of this part, refer to related descriptions of step 105 in the embodiment corresponding to FIG. 1. Details are not described herein again.

Optionally, that the third check matrix is obtained based on the first check matrix, the second check matrix, and a location of the at least one erroneous codeword group in the initial codeword includes:

the third check matrix is obtained by tailoring the first check matrix and the second check matrix that are concatenated; in the third check matrix, a concatenation relationship between a remaining part of the second check matrix after tailoring and the first check matrix is related to the location of the at least one erroneous codeword group in the initial codeword; and a proportion of the remaining part of the second check matrix after tailoring in the second check matrix is related to a proportion of the partial sub check codeword in the sub check codeword.

For specific descriptions of this part, refer to related descriptions of step 106 in the embodiment corresponding to FIG. 1. Details are not described herein again.

Optionally, the first check matrix includes a sparse matrix and a lower triangular matrix disposed on the right of the sparse matrix, the second check matrix includes a sparse matrix and a lower triangular matrix disposed on the right of the sparse matrix, the third check matrix includes a sparse matrix and a lower triangular matrix disposed on the right of the sparse matrix, the at least one erroneous codeword group includes the first codeword group, and that the third check matrix is obtained by tailoring the first check matrix and the second check matrix that are concatenated includes:

in the first check matrix and the second check matrix that are concatenated, a row number of a first row of the lower triangular matrix of the second check matrix is a row number of a last row of the first check matrix plus 1, and a column number of a first column of the lower triangular matrix of the second check matrix is a column number of a last column of the first check matrix plus 1; a quantity of rows and a quantity of columns by which the first check matrix and the second check matrix that are concatenated are tailored are determined based on a proportion of the first partial sub check codeword in the first sub check codeword; the sparse matrix of the third check matrix includes the sparse matrix of the first check matrix and a part of the sparse matrix of the second check matrix, and the lower triangular matrix of the third check matrix includes the lower triangular matrix of the first check matrix and a part of the lower triangular matrix of the second check matrix.

That a concatenation relationship between a remaining part of the second check matrix after tailoring and the first check matrix is related to the location of the at least one erroneous codeword group in the initial codeword includes:

the sparse matrix of the second check matrix is concatenated at the bottom of the sparse matrix of the first check matrix, and a concatenation location is consistent with a location of the first codeword group in the initial codeword.

That a proportion of the remaining part of the second check matrix after tailoring in the second check matrix is related to a proportion of the partial sub check codeword in the sub check codeword includes:

a proportion of a remaining part of the lower triangular matrix of the second check matrix after tailoring in the lower triangular matrix of the second check matrix is equal to a square of the proportion of the first partial sub check codeword in the first sub check codeword.

For specific descriptions of this part, refer to related descriptions in the embodiment corresponding to FIG. 4a and FIG. 4b. Details are not described herein again.

Optionally, the first check matrix includes a sparse matrix and a lower triangular matrix disposed on the right of the sparse matrix, the second check matrix includes sparse matrices and a lower triangular matrix disposed on the right of the sparse matrices, the third check matrix includes a sparse matrix and a lower triangular matrix disposed on the right of the sparse matrix, the at least one erroneous codeword group includes the first codeword group and the second codeword group, and that the third check matrix is obtained by tailoring the first check matrix and the second check matrix that are concatenated includes:

in the first check matrix and the second check matrix that are concatenated, a row number of a first row of the lower triangular matrix of the second check matrix is a row number of a last row of the first check matrix plus 1, and a column number of a first column of the lower triangular matrix of the second check matrix is a column number of a last column of the first check matrix plus 1; a quantity of rows and a quantity of columns by which the first check matrix and the second check matrix that are concatenated are tailored are determined based on a proportion of the first partial sub check codeword in the first sub check codeword and a proportion of the second partial sub check codeword in the second sub check codeword; the sparse matrix of the third check matrix includes the sparse matrix of the first check matrix and two parts of the sparse matrices of the second check matrix, and the lower triangular matrix of the third check matrix includes the lower triangular matrix of the first check matrix and a part of the lower triangular matrix of the second check matrix.

That a concatenation relationship between a remaining part of the second check matrix after tailoring and the first check matrix is related to the location of the at least one erroneous codeword group in the initial codeword includes:

the sparse matrices of the second check matrix are respectively concatenated at two locations below the sparse matrix of the first check matrix, a first concatenation location is consistent with a location of the first codeword group in the initial codeword, and a second concatenation location is consistent with a location of the second codeword group in the initial codeword.

That a proportion of the remaining part of the second check matrix after tailoring in the second check matrix is related to a proportion of the partial sub check codeword in the sub check codeword includes:

a proportion of a remaining part of the lower triangular matrix of the second check matrix after tailoring in the lower triangular matrix of the second check matrix is equal to a square of a sum of the proportion of the first partial sub check codeword in the first sub check codeword and the proportion of the second partial sub check codeword in the second sub check codeword.

For specific descriptions of this part, refer to related descriptions in the embodiment corresponding to FIG. 5a and FIG. 5b. Details are not described herein again.

Optionally, the first check matrix includes a sparse matrix and a lower triangular matrix disposed on the right of the sparse matrix, the second check matrix includes a sparse matrix and a lower triangular matrix disposed on the right of the sparse matrix, the third check matrix includes a sparse matrix and a lower triangular matrix disposed on the right of the sparse matrix, the at least one erroneous codeword group includes the first codeword group and the second codeword group, and that the third check matrix is obtained by tailoring the first check matrix and the second check matrix that are concatenated includes:

the third check matrix is obtained based on an intermediate matrix, the second check matrix, and a location of the second codeword group in the initial codeword, where in the intermediate matrix and the second check matrix that are concatenated, a row number of a first row of the lower triangular matrix of the second check matrix is a row number of a last row of the intermediate matrix plus 1, and a column number of a first column of the lower triangular matrix of the second check matrix is a column number of a last column of the intermediate matrix plus 1; a quantity of rows and a quantity of columns by which the intermediate matrix and the second check matrix that are concatenated are tailored are determined based on a proportion of the first partial sub check codeword in the first sub check codeword and a proportion of the second partial sub check codeword in the second sub check codeword; the sparse matrix of the third check matrix includes a sparse matrix of the intermediate matrix and a part of the sparse matrix of the second check matrix, and the lower triangular matrix of the third check matrix includes a lower triangular matrix of the intermediate matrix and a part of the lower triangular matrix of the second check matrix.

That a concatenation relationship between a remaining part of the second check matrix after tailoring and the first check matrix is related to the location of the at least one erroneous codeword group in the initial codeword includes:

the sparse matrix of the second check matrix after tailoring is concatenated at the bottom of the sparse matrix of the intermediate matrix, and a concatenation location is consistent with the location of the second codeword group in the initial codeword.

That a proportion of the remaining part of the second check matrix after tailoring in the second check matrix is related to a proportion of the partial sub check codeword in the sub check codeword includes:

a proportion of a remaining part of the lower triangular matrix of the second check matrix after tailoring in the lower triangular matrix of the second check matrix is equal to a square of the proportion of the second partial sub check codeword in the second sub check codeword.

The intermediate matrix is obtained by tailoring the first check matrix and the second check matrix that are concatenated; in the first check matrix and the second check matrix that are concatenated, a row number of a first row of a lower triangular matrix of the second check matrix is a row number of a last row of the first check matrix plus 1, and a column number of a first column of the lower triangular matrix of the second check matrix is a column number of a last column of the first check matrix plus 1; a quantity of rows and a quantity of columns by which the first check matrix and the second check matrix that are concatenated are tailored are determined based on the proportion of the first partial sub check codeword in the first sub check codeword; the sparse matrix of the intermediate matrix includes the sparse matrix of the first check matrix and a part of a sparse matrix of the second check matrix, and the lower triangular matrix of the intermediate matrix includes the lower triangular matrix of the first check matrix and a part of the lower triangular matrix of the second check matrix.

In the intermediate matrix, the sparse matrix of the second check matrix is concatenated at the bottom of the sparse matrix of the first check matrix, and a concatenation location is consistent with a location of the first codeword group in the initial codeword; and a proportion of a remaining part of the lower triangular matrix of the second check matrix after tailoring in the lower triangular matrix of the second check matrix is equal to a square of the proportion of the first partial sub check codeword in the first sub check codeword.

For specific descriptions of this part, refer to related descriptions in the embodiment corresponding to FIG. 6a to FIG. 6d. Details are not described herein again.

Figure 8:
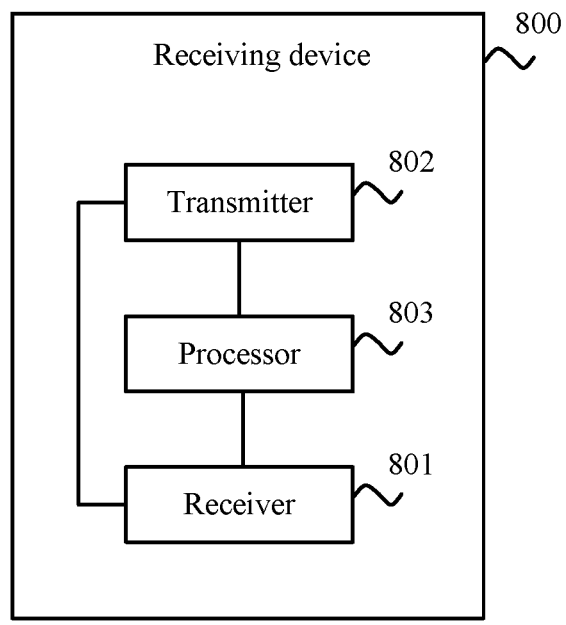
FIG. 8 is a diagram of a hardware structure of a receiving device according to an embodiment of the present invention.

In this embodiment of the present invention, the receiving unit 701 may be implemented by a receiver, the sending unit 702 may be implemented by a transmitter, and the processing unit 703 may be implemented by a processor. As shown in FIG. 8, a receiving device 800 may include a receiver 801, a transmitter 802, and a processor 803. Optionally, the receiving device 800 may further include a memory configured to store code and the like executed by the processor 803. The processor 803 is configured to invoke the code and the like stored in the memory, to execute the following operations:

triggering the receiver 801 to receive a first data frame sent by a transmitting apparatus, where the first data frame includes an initial codeword and a check codeword, the check codeword is obtained after the initial codeword is encoded based on a first check matrix, and the initial codeword has a plurality of codeword groups;

recognizing at least one erroneous codeword group in the initial codeword;

triggering the transmitter 802 to send an error indication message to the transmitting apparatus, where the error indication message carries an identifier of the at least one erroneous codeword group;

triggering the receiver 801 to obtain a second data frame sent by the transmitting apparatus based on the error indication message, where the second data frame includes a partial sub check codeword, the partial sub check codeword is a part of a sub check codeword, and the sub check codeword is obtained after the at least one erroneous codeword group is encoded by using a second check matrix; and decoding the partial sub check codeword, the initial codeword, and the check codeword by using a third check matrix, to obtain the initial codeword, where the third check matrix is obtained based on the first check matrix, the second check matrix, and a location of the at least one erroneous codeword group in the initial codeword.

Optionally, the processor 803 may be a central processing unit (CPU), the memory may be an internal memory of a random access memory (RAM) type, the receiver 801 and the transmitter 802 may include a common physical interface, and the physical interface may be an Ethernet interface or an asynchronous transfer mode (ATM) interface. The processor 803, the transmitter 802, the receiver 801, and the memory may be integrated into one or more independent circuits or hardware, for example, an application specific integrated circuit (ASIC).

Figure 9:
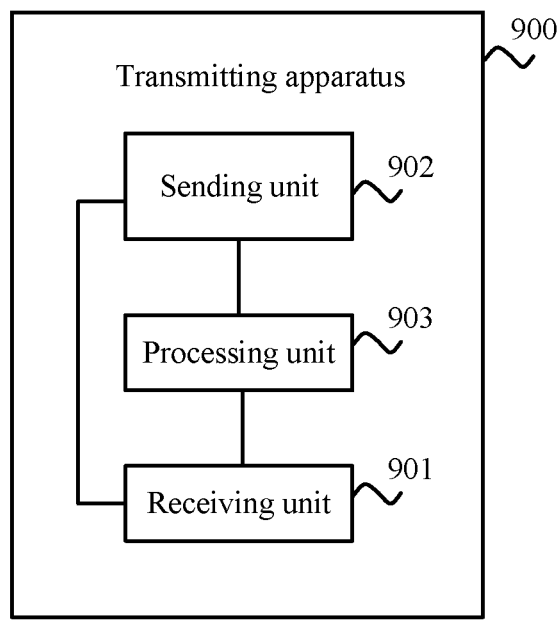
FIG. 9 is a diagram of an apparatus structure of a transmitting apparatus according to an embodiment of the present invention.

FIG. 9 is a diagram of an apparatus structure of a transmitting apparatus according to an embodiment of the present invention. The transmitting apparatus 900 includes a receiving unit 901, a sending unit 902, and a processing unit 903.

The processing unit 903 is configured to encode an initial codeword based on a first check matrix to obtain a check codeword, where the initial codeword has a plurality of codeword groups.

For specific descriptions of this part, refer to related descriptions of step 100 in the embodiment corresponding to FIG. 1. Details are not described herein again.

The sending unit 902 is configured to send a first data frame to a receiving apparatus, where the first data frame includes the initial codeword and the check codeword.

For specific descriptions of this part, refer to related descriptions of step 101 in the embodiment corresponding to FIG. 1. Details are not described herein again.

The receiving unit 901 is configured to obtain error indication information returned by the receiving apparatus, where the error indication information carries an identifier of at least one erroneous codeword group.

For specific descriptions of this part, refer to related descriptions of step 103 in the embodiment corresponding to FIG. 1. Details are not described herein again.

The processing unit 903 is further configured to obtain the at least one erroneous codeword group based on the identifier of the at least one erroneous codeword group.

For specific descriptions of this part, refer to related descriptions of step 104 in the embodiment corresponding to FIG. 1. Details are not described herein again.

The processing unit 903 is further configured to encode the at least one erroneous codeword group based on a second check matrix to obtain a sub check codeword.

For specific descriptions of this part, refer to related descriptions of step 104 in the embodiment corresponding to FIG. 1. Details are not described herein again.

The sending unit 902 is further configured to send a second data frame including a partial sub check codeword to the receiving apparatus, where the partial sub check codeword is a part of the sub check codeword.

For specific descriptions of this part, refer to related descriptions of step 105 in the embodiment corresponding to FIG. 1. Details are not described herein again.

Optionally, the at least one erroneous codeword group includes a first codeword group, the partial sub check codeword includes a first partial sub check codeword, the sub check codeword includes a first sub check codeword, the first partial sub check codeword is a part of the first sub check codeword, and the first sub check codeword is obtained after the first codeword group is encoded by using the second check matrix.

For specific descriptions of this part, refer to related descriptions of step 105 in the embodiment corresponding to FIG. 1. Details are not described herein again.

Optionally, the at least one erroneous codeword group includes a first codeword group and a second codeword group, the partial sub check codeword includes a first partial sub check codeword and a second partial sub check codeword, the sub check codeword includes a first sub check codeword and a second sub check codeword, the first partial sub check codeword is a part of the first sub check codeword, the second partial sub check codeword is a part of the second sub check codeword, the first sub check codeword is obtained after the first codeword group is encoded by using the second check matrix, and the second sub check codeword is obtained after the second codeword group is encoded by using the second check matrix.

For specific descriptions of this part, refer to related descriptions of step 105 in the embodiment corresponding to FIG. 1. Details are not described herein again.

Figure 10:
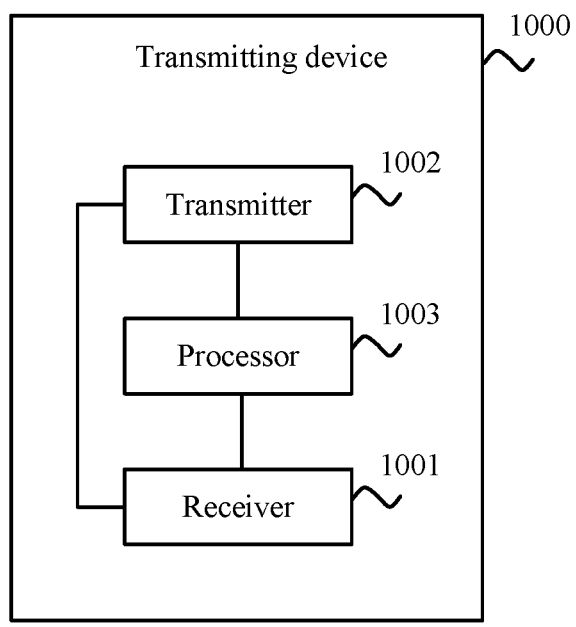
FIG. 10 is a diagram of a hardware structure of a transmitting device according to an embodiment of the present invention.

In this embodiment of the present invention, the receiving unit 901 may be implemented by a receiver, the sending unit 902 may be implemented by a transmitter, and the processing unit 903 may be implemented by a processor. As shown in FIG. 10, a transmitting device 1000 may include a receiver 1001, a transmitter 1002, and a processor 1003. Optionally, the transmitting device 1000 may further include a memory configured to store code and the like executed by the processor 1003. The processor 1003 is configured to invoke the code and the like stored in the memory, to execute the following operations:

encoding an initial codeword based on a first check matrix to obtain a check codeword, where the initial codeword has a plurality of codeword groups;

triggering the transmitter 1002 to send a first data frame to a receiving apparatus, where the first data frame includes the initial codeword and the check codeword;

triggering the receiver 1001 to obtain error indication information returned by the receiving apparatus, where the error indication information carries an identifier of at least one erroneous codeword group;

obtaining the at least one erroneous codeword group based on the identifier of the at least one erroneous codeword group;

encoding the at least one erroneous codeword group based on a second check matrix to obtain a sub check codeword; and triggering the transmitter 1002 to send a second data frame including a partial sub check codeword to the receiving apparatus, where the partial sub check codeword is a part of the sub check codeword.

Optionally, the processor 1003 may be a CPU, the memory may be an internal memory of a RAM type, the receiver 1001 and the transmitter 1002 may include a common physical interface, and the physical interface may be an Ethernet interface or an ATM interface. The processor 1003, the transmitter 1002, the receiver 1001, and the memory may be integrated into one or more independent circuits or hardware, for example, an ASIC.

A data retransmission system according to the embodiments of the present invention may include the foregoing receiving device 800 and transmitting device 1000.

The word "first" in the first data frame, the first check matrix, the first codeword group, the first sub check codeword, and the first partial sub check codeword that are mentioned in the embodiments of the present invention is merely used for identifying a name, and does not mean being the first in a sequence. For the words "second" and "third", this rule also applies.

Persons of ordinary skill in the art may understand that all or a part of the steps of the method in the embodiments of the present invention may be implemented by a program instructing relevant hardware. The program may be stored in a computer readable storage medium. When the program runs, the steps of the method in the embodiments of the present invention are performed. The storage medium may be at least one of the following media: media that are capable of storing program code, such as a Read-Only Memory (ROM), a RAM, a magnetic disk, or an optical disc.

It should be noted that the embodiments in this specification are all described in a progressive manner, for same or similar parts in the embodiments, reference may be made to these embodiments, and each embodiment focuses on a difference from other embodiments. Especially, device and system embodiments are basically similar to a method embodiment, and therefore is described briefly; for related parts, reference may be made to partial descriptions in the method embodiment. The described device and system embodiments are merely examples. The units described as separate parts may or may not be physically separate, and parts displayed as units may or may not be physical units, may be located in one position, or may be distributed on a plurality of network units. Some or all of the modules may be selected according to actual needs to achieve the objectives of the solutions of the embodiments. A person of ordinary skill in the art may understand and implement the embodiments of the present invention without creative efforts.

The foregoing descriptions are merely examples of embodiments of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A method of data transmission, comprising:
receiving, by a receiving apparatus from a transmitting apparatus, a first data frame comprising an initial codeword and a check codeword, the check codeword is obtained after the initial codeword is encoded based on a first check matrix, and the initial codeword has a plurality of codeword groups;
recognizing, by the receiving apparatus, at least one erroneous codeword group in the initial codeword;
sending, by the receiving apparatus, an error indication message to the transmitting apparatus, wherein the error indication message carries an identifier of the at least one erroneous codeword group;
obtaining, by the receiving apparatus from a transmitting apparatus based on the error indication message, a second data frame comprising a partial sub check codeword, the partial sub check codeword is a part of a sub check codeword, and the sub check codeword is obtained after the at least one erroneous codeword group is encoded by using a second check matrix; and
decoding, by the receiving apparatus, the partial sub check codeword, the initial codeword, and the check codeword by using a third check matrix, to obtain the initial codeword, wherein the third check matrix is obtained based on the first check matrix, the second check matrix, and a location of the at least one erroneous codeword group in the initial codeword.

2. The method according to claim 1, wherein the at least one erroneous codeword group comprises a first codeword group, the partial sub check codeword comprises a first partial sub check codeword, the sub check codeword comprises a first sub check codeword, the first partial sub check codeword is a part of the first sub check codeword, and the first sub check codeword is obtained after the first codeword group is encoded by using the second check matrix.

3. The method according to claim 1, wherein the at least one erroneous codeword group comprises a first codeword group and a second codeword group, the partial sub check codeword comprises a first partial sub check codeword and a second partial sub check codeword, the sub check codeword comprises a first sub check codeword and a second sub check codeword, the first partial sub check codeword is a part of the first sub check codeword, the second partial sub check codeword is a part of the second sub check codeword, the first sub check codeword is obtained after the first codeword group is encoded by using the second check matrix, and the second sub check codeword is obtained after the second codeword group is encoded by using the second check matrix.

4. The method according to claim 1, wherein that the third check matrix is obtained based on the first check matrix, the second check matrix, and a location of the at least one erroneous codeword group in the initial codeword comprises:
the third check matrix is obtained by tailoring the first check matrix and the second check matrix that are concatenated; in the third check matrix, a concatenation relationship between a remaining part of the second check matrix after tailoring and the first check matrix is related to the location of the at least one erroneous codeword group in the initial codeword; and a proportion of the remaining part of the second check matrix after tailoring in the second check matrix is related to a proportion of the partial sub check codeword in the sub check codeword.

5. The method according to claim 4, wherein the first check matrix comprises a sparse matrix and a lower triangular matrix disposed on the right of the sparse matrix, the second check matrix comprises a sparse matrix and a lower triangular matrix disposed on the right of the sparse matrix, the third check matrix comprises a sparse matrix and a lower triangular matrix disposed on the right of the sparse matrix, the at least one erroneous codeword group comprises the first codeword group, and that the third check matrix is obtained by tailoring the first check matrix and the second check matrix that are concatenated comprises:
in the first check matrix and the second check matrix that are concatenated, a row number of a first row of the lower triangular matrix of the second check matrix is a row number of a last row of the first check matrix plus 1, and a column number of a first column of the lower triangular matrix of the second check matrix is a column number of a last column of the first check matrix plus 1; a quantity of rows and a quantity of columns by which the first check matrix and the second check matrix that are concatenated are tailored are determined based on a proportion of the first partial sub check codeword in the first sub check codeword; the sparse matrix of the third check matrix comprises the sparse matrix of the first check matrix and a part of the sparse matrix of the second check matrix, and the lower triangular matrix of the third check matrix comprises the lower triangular matrix of the first check matrix and a part of the lower triangular matrix of the second check matrix;
that a concatenation relationship between a remaining part of the second check matrix after tailoring and the first check matrix is related to the location of the at least one erroneous codeword group in the initial codeword comprises:
the sparse matrix of the second check matrix is concatenated at the bottom of the sparse matrix of the first check matrix, and a concatenation location is consistent with a location of the first codeword group in the initial codeword; and
that a proportion of the remaining part of the second check matrix after tailoring in the second check matrix is related to a proportion of the partial sub check codeword in the sub check codeword comprises:
a proportion of a remaining part of the lower triangular matrix of the second check matrix after tailoring in the lower triangular matrix of the second check matrix is equal to a square of the proportion of the first partial sub check codeword in the first sub check codeword.

6. The method according to claim 4, wherein the first check matrix comprises a sparse matrix and a lower triangular matrix disposed on the right of the sparse matrix, the second check matrix comprises sparse matrices and a lower triangular matrix disposed on the right of the sparse matrices, the third check matrix comprises a sparse matrix and a lower triangular matrix disposed on the right of the sparse matrix, the at least one erroneous codeword group comprises the first codeword group and the second codeword group, and that the third check matrix is obtained by tailoring the first check matrix and the second check matrix that are concatenated comprises:

in the first check matrix and the second check matrix that are concatenated, a row number of a first row of the lower triangular matrix of the second check matrix is a row number of a last row of the first check matrix plus 1, and a column number of a first column of the lower triangular matrix of the second check matrix is a column number of a last column of the first check matrix plus 1; a quantity of rows and a quantity of columns by which the first check matrix and the second check matrix that are concatenated are tailored are determined based on a proportion of the first partial sub check codeword in the first sub check codeword and a proportion of the second partial sub check codeword in the second sub check codeword; the sparse matrix of the third check matrix comprises the sparse matrix of the first check matrix and two parts of the sparse matrices of the second check matrix, and the lower triangular matrix of the third check matrix comprises the lower triangular matrix of the first check matrix and a part of the lower triangular matrix of the second check matrix;

that a concatenation relationship between a remaining part of the second check matrix after tailoring and the first check matrix is related to the location of the at least one erroneous codeword group in the initial codeword comprises:

the sparse matrices of the second check matrix are respectively concatenated at two locations below the sparse matrix of the first check matrix, a first concatenation location is consistent with a location of the first codeword group in the initial codeword, and a second concatenation location is consistent with a location of the second codeword group in the initial codeword; and that a proportion of the remaining part of the second check matrix after tailoring in the second check matrix is related to a proportion of the partial sub check codeword in the sub check codeword comprises:

a proportion of a remaining part of the lower triangular matrix of the second check matrix after tailoring in the lower triangular matrix of the second check matrix is equal to a square of a sum of the proportion of the first partial sub check codeword in the first sub check codeword and the proportion of the second partial sub check codeword in the second sub check codeword.

7. The method according to claim 4, wherein the first check matrix comprises a sparse matrix and a lower triangular matrix disposed on the right of the sparse matrix, the second check matrix comprises a sparse matrix and a lower triangular matrix disposed on the right of the sparse matrix, the third check matrix comprises a sparse matrix and a lower triangular matrix disposed on the right of the sparse matrix, the at least one erroneous codeword group comprises the first codeword group and the second codeword group, and that the third check matrix is obtained by tailoring the first check matrix and the second check matrix that are concatenated comprises:

the third check matrix is obtained based on an intermediate matrix, the second check matrix, and a location of the second codeword group in the initial codeword, wherein in the intermediate matrix and the second check matrix that are concatenated, a row number of a first row of the lower triangular matrix of the second check matrix is a row number of a last row of the intermediate matrix plus 1, and a column number of a first column of the lower triangular matrix of the second check matrix is a column number of a last column of the intermediate matrix plus 1; a quantity of rows and a quantity of columns by which the intermediate matrix and the second check matrix that are concatenated are tailored are determined based on a proportion of the first partial sub check codeword in the first sub check codeword and a proportion of the second partial sub check codeword in the second sub check codeword; the sparse matrix of the third check matrix comprises a sparse matrix of the intermediate matrix and a part of the sparse matrix of the second check matrix, and the lower triangular matrix of the third check matrix comprises a lower triangular matrix of the intermediate matrix and a part of the lower triangular matrix of the second check matrix;

that a concatenation relationship between a remaining part of the second check matrix after tailoring and the first check matrix is related to the location of the at least one erroneous codeword group in the initial codeword comprises:

the sparse matrix of the second check matrix after tailoring is concatenated at the bottom of the sparse matrix of the intermediate matrix, and a concatenation location is consistent with the location of the second codeword group in the initial codeword;

that a proportion of the remaining part of the second check matrix after tailoring in the second check matrix is related to a proportion of the partial sub check codeword in the sub check codeword comprises:

a proportion of a remaining part of the lower triangular matrix of the second check matrix after tailoring in the lower triangular matrix of the second check matrix is equal to a square of the proportion of the second partial sub check codeword in the second sub check codeword;

the intermediate matrix is obtained by tailoring the first check matrix and the second check matrix that are concatenated; in the first check matrix and the second check matrix that are concatenated, a row number of a first row of a lower triangular matrix of the second check matrix is a row number of a last row of the first check matrix plus 1, and a column number of a first column of the lower triangular matrix of the second check matrix is a column number of a last column of the first check matrix plus 1; a quantity of rows and a quantity of columns by which the first check matrix and the second check matrix that are concatenated are tailored are determined based on the proportion of the first partial sub check codeword in the first sub check codeword; the sparse matrix of the intermediate matrix comprises the sparse matrix of the first check matrix and a part of a sparse matrix of the second check matrix, and the lower triangular matrix of the intermediate matrix comprises the lower triangular matrix of the first check matrix and a part of the lower triangular matrix of the second check matrix; and in the intermediate matrix, the sparse matrix of the second check matrix is concatenated at the bottom of the sparse matrix of the first check matrix, and a concatenation location is consistent with a location of the first codeword group in the initial codeword; and a proportion of a remaining part of the lower triangular matrix of the second check matrix after tailoring in the lower triangular matrix of the second check matrix is equal to a square of the proportion of the first partial sub check codeword in the first sub check codeword.

8. A receiving apparatus, comprising:

a receiver to receive from a transmitting apparatus a first data frame comprising an initial codeword and a check codeword, the check codeword is obtained after the initial codeword is encoded based on a first check matrix, and the initial codeword has a plurality of codeword groups;

a processor to recognize at least one erroneous codeword group in the initial codeword; and a transmitter to send an error indication message to the transmitting apparatus, wherein the error indication message carries an identifier of the at least one erroneous codeword group;

the receiver is further to obtain a second data frame from the transmitting apparatus based on the error indication message, wherein the second data frame comprises a partial sub check codeword, the partial sub check codeword is a part of a sub check codeword, and the sub check codeword is obtained after the at least one erroneous codeword group is encoded by using a second check matrix; and the processor is further to decode the partial sub check codeword, the initial codeword, and the check codeword by using a third check matrix, to obtain the initial codeword, wherein the third check matrix is obtained based on the first check matrix, the second check matrix, and a location of the at least one erroneous codeword group in the initial codeword.

9. The apparatus according to claim 8, wherein the at least one erroneous codeword group comprises a first codeword group, the partial sub check codeword comprises a first partial sub check codeword, the sub check codeword comprises a first sub check codeword, the first partial sub check codeword is a part of the first sub check codeword, and the first sub check codeword is obtained after the first codeword group is encoded by using the second check matrix.

10. The apparatus according to claim 8, wherein the at least one erroneous codeword group comprises a first codeword group and a second codeword group, the partial sub check codeword comprises a first partial sub check codeword and a second partial sub check codeword, the sub check codeword comprises a first sub check codeword and a second sub check codeword, the first partial sub check codeword is a part of the first sub check codeword, the second partial sub check codeword is a part of the second sub check codeword, the first sub check codeword is obtained after the first codeword group is encoded by using the second check matrix, and the second sub check codeword is obtained after the second codeword group is encoded by using the second check matrix.

11. The apparatus according to claim 8, wherein that the third check matrix is obtained based on the first check matrix, the second check matrix, and a location of the at least one erroneous codeword group in the initial codeword comprises:

the third check matrix is obtained by tailoring the first check matrix and the second check matrix that are concatenated; in the third check matrix, a concatenation relationship between a remaining part of the second check matrix after tailoring and the first check matrix is related to the location of the at least one erroneous codeword group in the initial codeword; and a proportion of the remaining part of the second check matrix after tailoring in the second check matrix is related to a proportion of the partial sub check codeword in the sub check codeword.

12. The apparatus according to claim 11, wherein the first check matrix comprises a sparse matrix and a lower triangular matrix disposed on the right of the sparse matrix, the second check matrix comprises a sparse matrix and a lower triangular matrix disposed on the right of the sparse matrix, the third check matrix comprises a sparse matrix and a lower triangular matrix disposed on the right of the sparse matrix, the at least one erroneous codeword group comprises the first codeword group, and that the third check matrix is obtained by tailoring the first check matrix and the second check matrix that are concatenated comprises:

in the first check matrix and the second check matrix that are concatenated, a row number of a first row of the lower triangular matrix of the second check matrix is a row number of a last row of the first check matrix plus 1, and a column number of a first column of the lower triangular matrix of the second check matrix is a column number of a last column of the first check matrix plus 1; a quantity of rows and a quantity of columns by which the first check matrix and the second check matrix that are concatenated are tailored are determined based on a proportion of the first partial sub check codeword in the first sub check codeword; the sparse matrix of the third check matrix comprises the sparse matrix of the first check matrix and a part of the sparse matrix of the second check matrix, and the lower triangular matrix of the third check matrix comprises the lower triangular matrix of the first check matrix and a part of the lower triangular matrix of the second check matrix;

that a concatenation relationship between a remaining part of the second check matrix after tailoring and the first check matrix is related to the location of the at least one erroneous codeword group in the initial codeword comprises:

the sparse matrix of the second check matrix is concatenated at the bottom of the sparse matrix of the first check matrix, and a concatenation location is consistent with a location of the first codeword group in the initial codeword; and that a proportion of the remaining part of the second check matrix after tailoring in the second check matrix is related to a proportion of the partial sub check codeword in the sub check codeword comprises:

a proportion of a remaining part of the lower triangular matrix of the second check matrix after tailoring in the lower triangular matrix of the second check matrix is equal to a square of the proportion of the first partial sub check codeword in the first sub check codeword.

13. The apparatus according to claim 11, wherein the first check matrix comprises a sparse matrix and a lower triangular matrix disposed on the right of the sparse matrix, the second check matrix comprises sparse matrices and a lower triangular matrix disposed on the right of the sparse matrices, the third check matrix comprises a sparse matrix and a lower triangular matrix disposed on the right of the sparse matrix, the at least one erroneous codeword group comprises the first codeword group and the second codeword group, and that the third check matrix is obtained by tailoring the first check matrix and the second check matrix that are concatenated comprises:

in the first check matrix and the second check matrix that are concatenated, a row number of a first row of the lower triangular matrix of the second check matrix is a row number of a last row of the first check matrix plus 1, and a column number of a first column of the lower triangular matrix of the second check matrix is a column number of a last column of the first check matrix plus 1; a quantity of rows and a quantity of columns by which the first check matrix and the second check matrix that are concatenated are tailored are determined based on a proportion of the first partial sub check codeword in the first sub check codeword and a proportion of the second partial sub check codeword in the second sub check codeword; the sparse matrix of the third check matrix comprises the sparse matrix of the first check matrix and two parts of the sparse matrices of the second check matrix, and the lower triangular matrix of the third check matrix comprises the lower triangular matrix of the first check matrix and a part of the lower triangular matrix of the second check matrix;

that a concatenation relationship between a remaining part of the second check matrix after tailoring and the first check matrix is related to the location of the at least one erroneous codeword group in the initial codeword comprises:

the sparse matrices of the second check matrix are respectively concatenated at two locations below the sparse matrix of the first check matrix, a first concatenation location is consistent with a location of the first codeword group in the initial codeword, and a second concatenation location is consistent with a location of the second codeword group in the initial codeword; and that a proportion of the remaining part of the second check matrix after tailoring in the second check matrix is related to a proportion of the partial sub check codeword in the sub check codeword comprises:

a proportion of a remaining part of the lower triangular matrix of the second check matrix after tailoring in the lower triangular matrix of the second check matrix is equal to a square of a sum of the proportion of the first partial sub check codeword in the first sub check codeword and the proportion of the second partial sub check codeword in the second sub check codeword.

14. The apparatus according to claim 11, wherein the first check matrix comprises a sparse matrix and a lower triangular matrix disposed on the right of the sparse matrix, the second check matrix comprises a sparse matrix and a lower triangular matrix disposed on the right of the sparse matrix, the third check matrix comprises a sparse matrix and a lower triangular matrix disposed on the right of the sparse matrix, the at least one erroneous codeword group comprises the first codeword group and the second codeword group, and that the third check matrix is obtained by tailoring the first check matrix and the second check matrix that are concatenated comprises:

the third check matrix is obtained based on an intermediate matrix, the second check matrix, and a location of the second codeword group in the initial codeword, wherein in the intermediate matrix and the second check matrix that are concatenated, a row number of a first row of the lower triangular matrix of the second check matrix is a row number of a last row of the intermediate matrix plus 1, and a column number of a first column of the lower triangular matrix of the second check matrix is a column number of a last column of the intermediate matrix plus 1; a quantity of rows and a quantity of columns by which the intermediate matrix and the second check matrix that are concatenated are tailored are determined based on a proportion of the first partial sub check codeword in the first sub check codeword and a proportion of the second partial sub check codeword in the second sub check codeword; the sparse matrix of the third check matrix comprises a sparse matrix of the intermediate matrix and a part of the sparse matrix of the second check matrix, and the lower triangular matrix of the third check matrix comprises a lower triangular matrix of the intermediate matrix and a part of the lower triangular matrix of the second check matrix;

that a concatenation relationship between a remaining part of the second check matrix after tailoring and the first check matrix is related to the location of the at least one erroneous codeword group in the initial codeword comprises:

the sparse matrix of the second check matrix after tailoring is concatenated at the bottom of the sparse matrix of the intermediate matrix, and a concatenation location is consistent with the location of the second codeword group in the initial codeword;

that a proportion of the remaining part of the second check matrix after tailoring in the second check matrix is related to a proportion of the partial sub check codeword in the sub check codeword comprises:

a proportion of a remaining part of the lower triangular matrix of the second check matrix after tailoring in the lower triangular matrix of the second check matrix is equal to a square of the proportion of the second partial sub check codeword in the second sub check codeword;

the intermediate matrix is obtained by tailoring the first check matrix and the second check matrix that are concatenated; in the first check matrix and the second check matrix that are concatenated, a row number of a first row of a lower triangular matrix of the second check matrix is a row number of a last row of the first check matrix plus 1, and a column number of a first column of the lower triangular matrix of the second check matrix is a column number of a last column of the first check matrix plus 1; a quantity of rows and a quantity of columns by which the first check matrix and the second check matrix that are concatenated are tailored are determined based on the proportion of the first partial sub check codeword in the first sub check codeword; the sparse matrix of the intermediate matrix comprises the sparse matrix of the first check matrix and a part of a sparse matrix of the second check matrix, and the lower triangular matrix of the intermediate matrix comprises the lower triangular matrix of the first check matrix and a part of the lower triangular matrix of the second check matrix; and in the intermediate matrix, the sparse matrix of the second check matrix is concatenated at the bottom of the sparse matrix of the first check matrix, and a concatenation location is consistent with a location of the first codeword group in the initial codeword; and a proportion of a remaining part of the lower triangular matrix of the second check matrix after tailoring in the lower triangular matrix of the second check matrix is equal to a square of the proportion of the first partial sub check codeword in the first sub check codeword.

* * * * *